(12) United States Patent
Ono

(10) Patent No.: US 9,099,357 B2
(45) Date of Patent: Aug. 4, 2015

(54) DISPLAY DEVICE AND METHOD OF MANUFACTURING DISPLAY DEVICE

(71) Applicant: Panasonic Liquid Crystal Display Co., Ltd., Himeji-shi, Hyogo (JP)

(72) Inventor: Kikuo Ono, Ibaraki (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 14/198,002

(22) Filed: Mar. 5, 2014

(65) Prior Publication Data

US 2014/0306223 A1 Oct. 16, 2014

(30) Foreign Application Priority Data

Apr. 15, 2013 (JP) ................................. 2013-084676

(51) Int. Cl.
*H01L 27/12* (2006.01)
(52) U.S. Cl.
CPC ............ *H01L 27/124* (2013.01); *H01L 27/127* (2013.01); *H01L 27/1248* (2013.01); *H01L 27/1262* (2013.01)
(58) Field of Classification Search
CPC ................ H01L 27/1214; H01L 27/12; G02F 1/136227
USPC ..................... 257/59, 412, E29.255, E33.053; 438/166
See application file for complete search history.

(56) References Cited

U.S. PATENT DOCUMENTS

| 5,852,485 A | 12/1998 | Shimada et al. |
| 2006/0145161 A1* | 7/2006 | Lee et al. ......................... 257/72 |
| 2008/0068516 A1 | 3/2008 | Mori et al. |
| 2010/0271582 A1* | 10/2010 | Yamakawa et al. ........... 349/138 |
| 2011/0175884 A1 | 7/2011 | Ono |
| 2013/0105803 A1* | 5/2013 | Song et al. ...................... 257/59 |

FOREIGN PATENT DOCUMENTS

| JP | 9-230380 | 9/1997 |
| JP | 2008-070763 | 3/2008 |

* cited by examiner

*Primary Examiner* — Karen Kusumakar
*Assistant Examiner* — Adam S Bowen
(74) *Attorney, Agent, or Firm* — Hamre, Schumann, Mueller & Larson, P.C.

(57) ABSTRACT

A display device includes a plurality of pixels arranged in a matrix. Each of the plurality of pixels includes a transistor and a pixel electrode arranged above the transistor through a first protective film and a second protective film. Among the plurality of pixels, the pixel electrodes of two pixels adjacent in a column direction are connected to corresponding source electrodes of the two pixels through second and third contact holes respectively. The second and third contact holes are formed in the first protective film within a first contact hole that is formed in the second protective film.

14 Claims, 24 Drawing Sheets

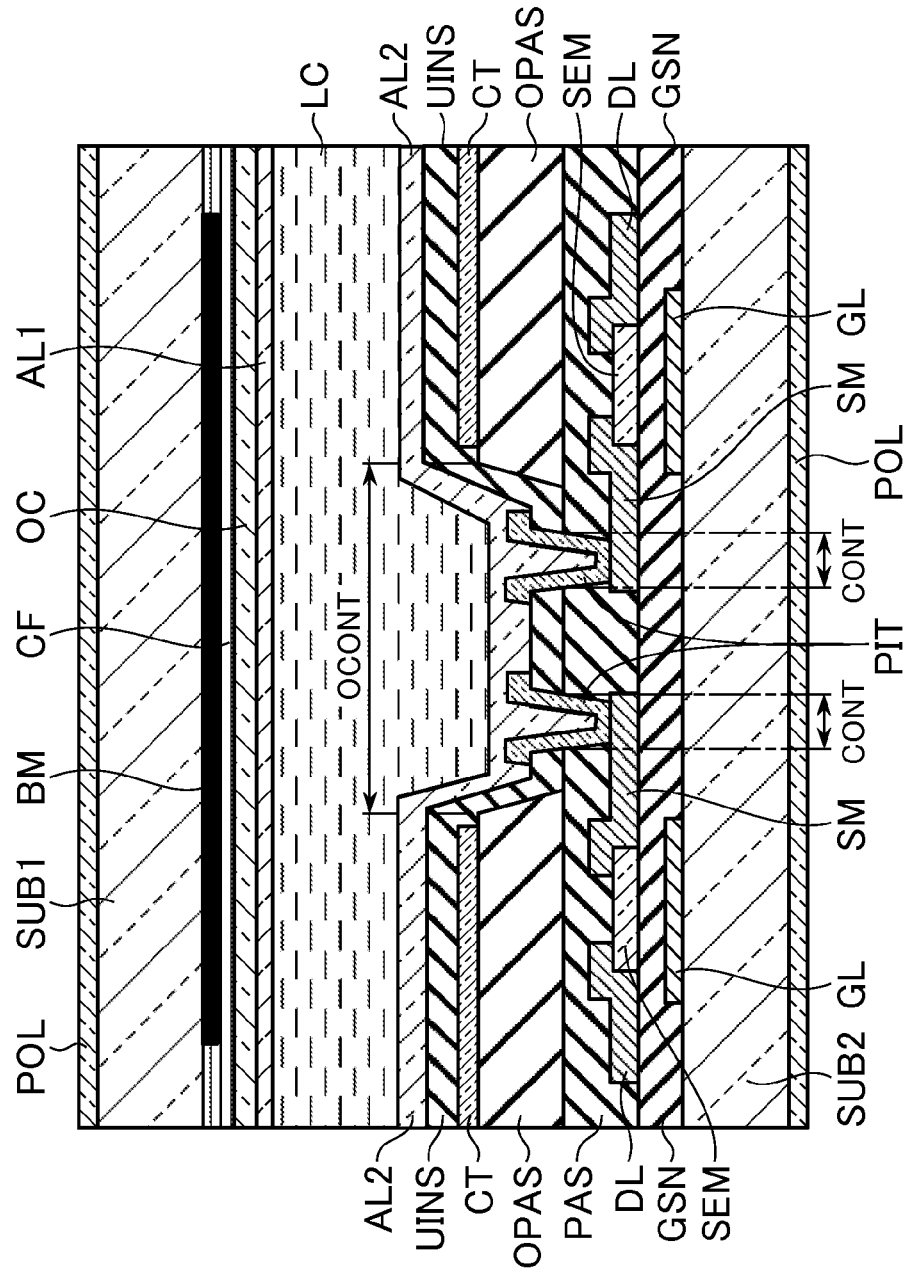

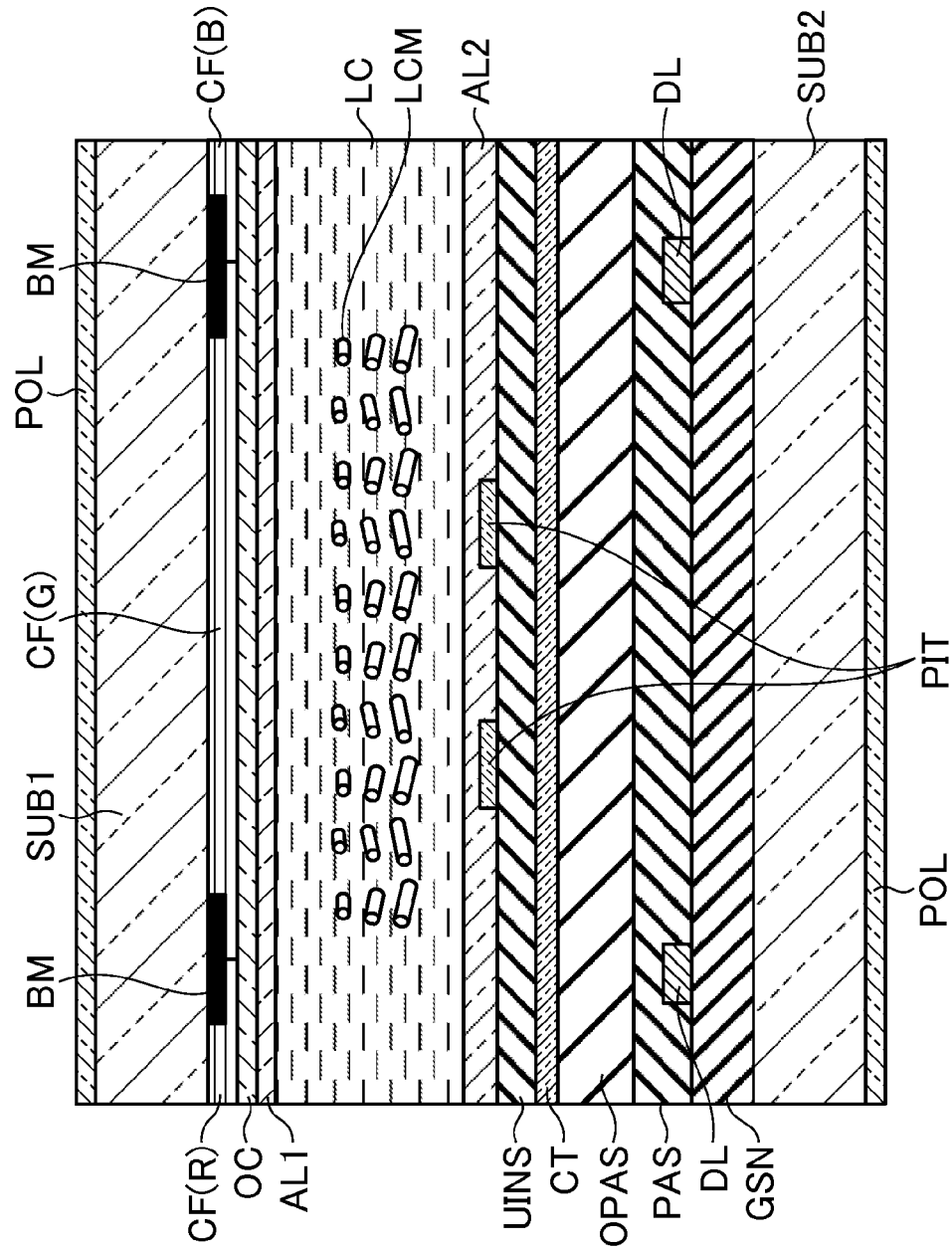

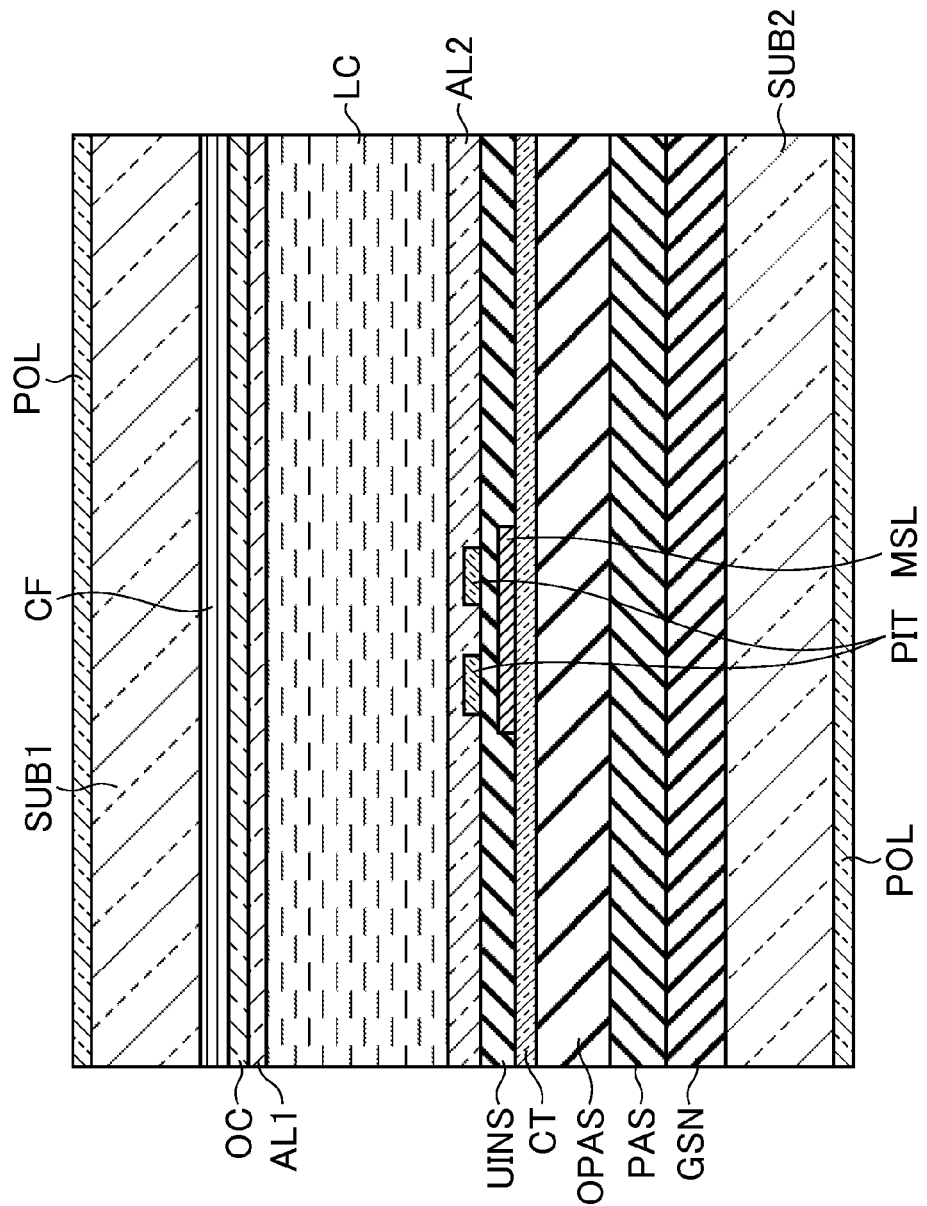

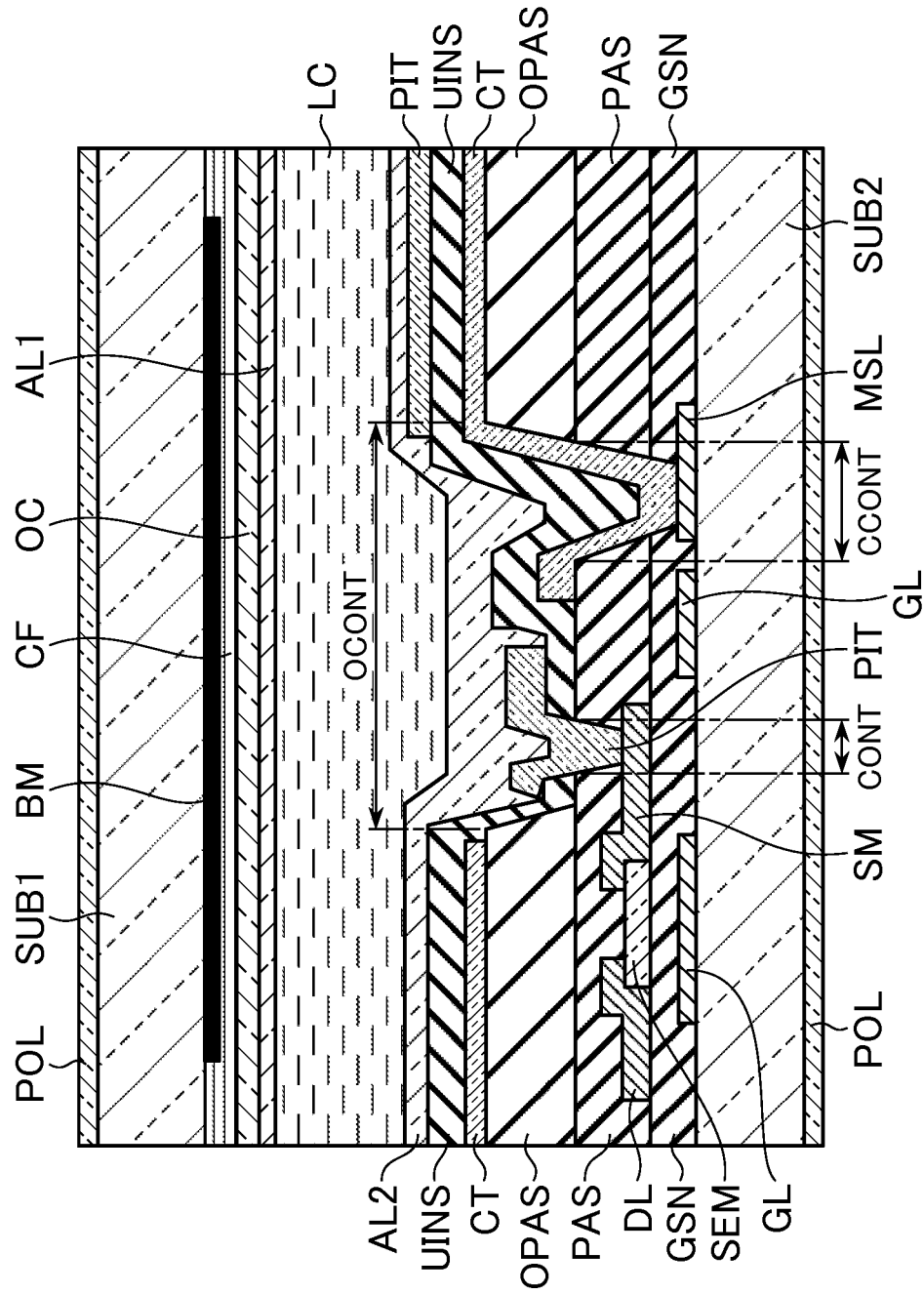

FIG.17A
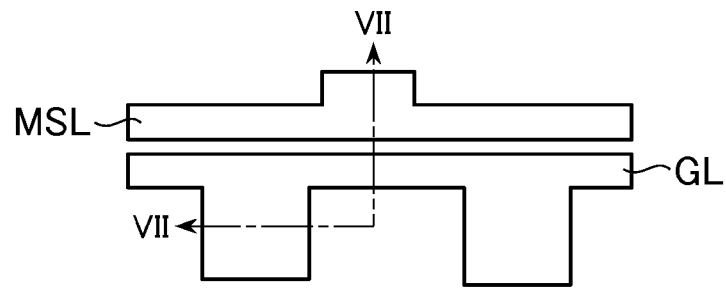
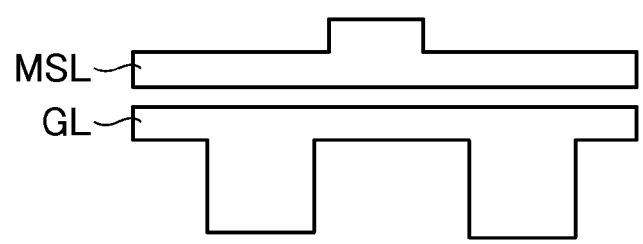
FIG.17B
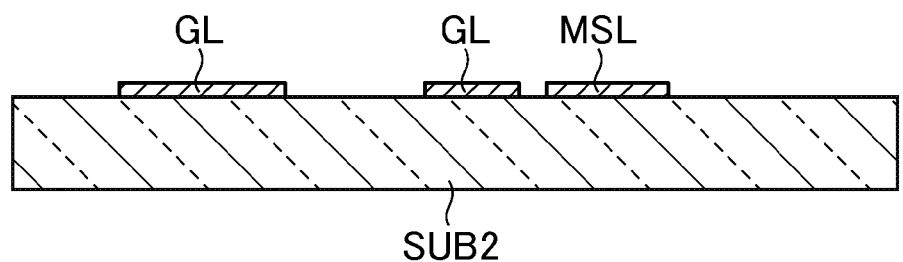

FIG.18A
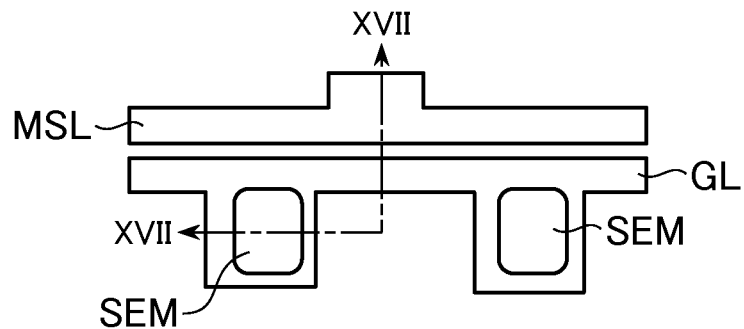
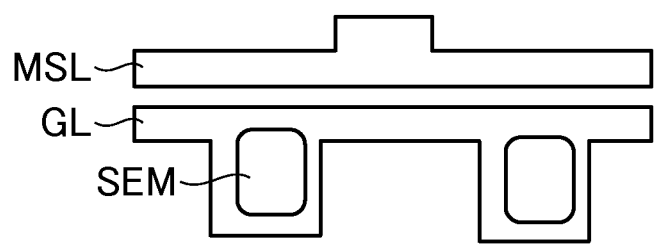
FIG.18B
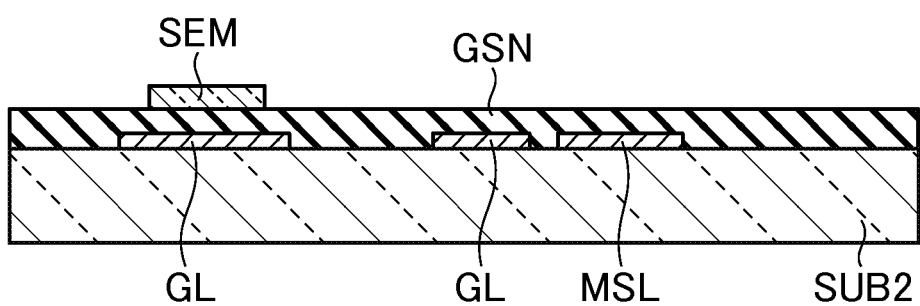

DISPLAY DEVICE AND METHOD OF MANUFACTURING DISPLAY DEVICE

CROSS-REFERENCE TO RELATED APPLICATION

The present application claims priority from Japanese Application JP2013-084676 filed on Apr. 15, 2013, the content of which is hereby incorporated by reference into this application.

TECHNICAL FIELD

The present invention relates to a display device and a method of manufacturing a display device.

BACKGROUND

For example, as shown in the Japanese Patent Application Publication No. H09-230380, a display device is known that includes an organic protective film which is formed to cover a TFT, a gate wiring and a source wiring and a pixel electrode which is formed on the organic protective film. In the display device described above, a contact hole is provided in the organic protective film, and a source electrode and the pixel electrode of the TFT are electrically connected through the contact hole.

SUMMARY

Here, the organic protective film is formed of, for example, photosensitive resist material, and is formed to be thicker than other insulating films. The organic protective film is generally opened by development processing in an exposure step, and it is formed to be thicker as described above. Thus, it is impossible to open the organic protective film with a small pattern dimension. Accordingly, the diameter of the contact hole provided in the organic protective film is increased as compared with a contact hole provided in an inorganic insulating film.

Hence, one or more embodiments of the present application has an object to provide a display device including a plurality of contact holes within a contact hole of a larger diameter so as to enhance an aperture ratio of a pixel, and a method of manufacturing such a display device.

In one general aspect, the instant application describes a display device that includes a plurality of pixels arranged in a matrix, each of the plurality of pixels including: a transistor; and a pixel electrode arranged above the transistor through a first protective film and a second protective film. Among the plurality of pixels, the pixel electrodes of two pixels adjacent in a column direction are connected to corresponding source electrodes of the two pixels through second and third contact holes respectively. The second and third contact holes are formed in the first protective film within a first contact hole that is formed in the second protective film. The above general aspect may include one or more of the following features. The first protective film may be an inorganic insulating film, and the second protective film may be an organic insulating film.

The display device may further include a plurality of gate wirings arranged in a row direction of the plurality of pixels; and a plurality of data wirings arranged in adjacent pairings in the column direction, with each set of adjacent pairings spaced further apart than a distance between the gate wirings of a given pairing.

Among the plurality of pixels, the transistors adjacent in the column direction may be staggered in the row direction.

In another general aspect, the display device of the instant application includes a transistor; a common electrode arranged above the transistor through a first protective film and a second protective film; a pixel electrode stacked on the common electrode through an insulting film and being opposite to the common electrode; and a common electrode wiring connected to the common electrode through the first protective film and the second protective film. The pixel electrode and the common electrode are connected to a source electrode of the transistor and the common electrode wiring through second and third contact holes respectively. The second and third contact holes are formed in the first protective film and are positioned within a first contact hole that is formed in the second protective film.

The above another general aspect may include one or more of the following features. The first protective film may be an inorganic insulating film, and the second protective film may be an organic insulating film.

The common electrode wiring may be formed in the same layer as a gate electrode of the transistor.

The display device may further include a gate insulating film formed on the gate electrode and the common electrode. The second contact hole may be formed in the first protective film and the gate insulating film. The common electrode may be connected to the common electrode wiring through the second contact hole.

The third contact hole may be formed in the first protective film and the insulting film. The pixel electrode may be connected to the source electrode of the transistor through the third contact hole.

In another general aspect, a method of manufacturing a display device of the instant application includes: forming a gate wiring on a substrate; forming a gate insulating film on the substrate on which the gate wiring is formed; forming at least two adjacent transistors on the gate insulating film; forming a protective film and an organic protective film in this order on the gate insulating film on which the two transistors are formed; forming a first contact hole in the organic protective film; forming a common electrode on the organic protective film; forming an upper insulting film on a region in which the first contact hole is formed and the common electrode; forming second and third contact holes in the protective film and the upper insulting film within the first contact hole, which are positioned above source electrodes of the two transistors; and forming a pixel electrode on the upper insulting film configured to cover the second and third contact holes and to be opposed to the common electrode.

In another general aspect, a method of manufacturing a display device of the instant application includes: forming a gate wiring and a common electrode wiring on a substrate; forming a gate insulating film on the substrate on which the gate wiring is formed; forming a transistor on the gate insulating film; forming a protective film and an organic protective film in this order on the gate insulating film on which the transistor is formed; forming a first contact hole by removing an upper portion of the organic protective film; forming a second contact hole in the protective film and the gate insulting film, which is positioned above the common electrode wiring within a region in which the first contact hole is formed; forming a common electrode on the second contact hole and the organic protective film; forming an upper insulting film at the region in which the first contact hole is formed and above the common electrode; forming a third contact hole in the upper insulting film and the protective film, which is formed above a source electrode of the transistor positioned within the region in which the first contact hole is formed; and forming a pixel electrode on the upper insulting film configured to cover the third contact hole and to be directed to the common electrode.

The above another general aspect may include one or more of the following features. The first contact hole and the second contact hole may be formed by a halftone exposure in the same step.

BRIEF DESCRIPTION OF THE DRAWINGS

FIG. 4 shows an example of a cross-sectional view taken along line IV-IV of FIG. 3.

FIG. 5 shows an example of a cross-sectional view taken along line V-V of FIG. 2.

FIG. 6 shows an example of a cross-sectional view taken along line VI-VI of FIG. 2.

FIG. 16 is a diagram showing an example of a cross-sectional view taken along line XVI-XVI of FIG. 15.

FIG. 17A is a diagram for illustrating a method of manufacturing a display device according to a second embodiment of the present application.

FIG. 17B is a diagram for illustrating a method of manufacturing a display device according to a second embodiment of the present application.

FIG. 18A is a diagram for illustrating a method of manufacturing a display device according to a second embodiment of the present application.

FIG. 18B is a diagram for illustrating a method of manufacturing a display device according to a second embodiment of the present application.

DETAILED DESCRIPTION

Figure 1:
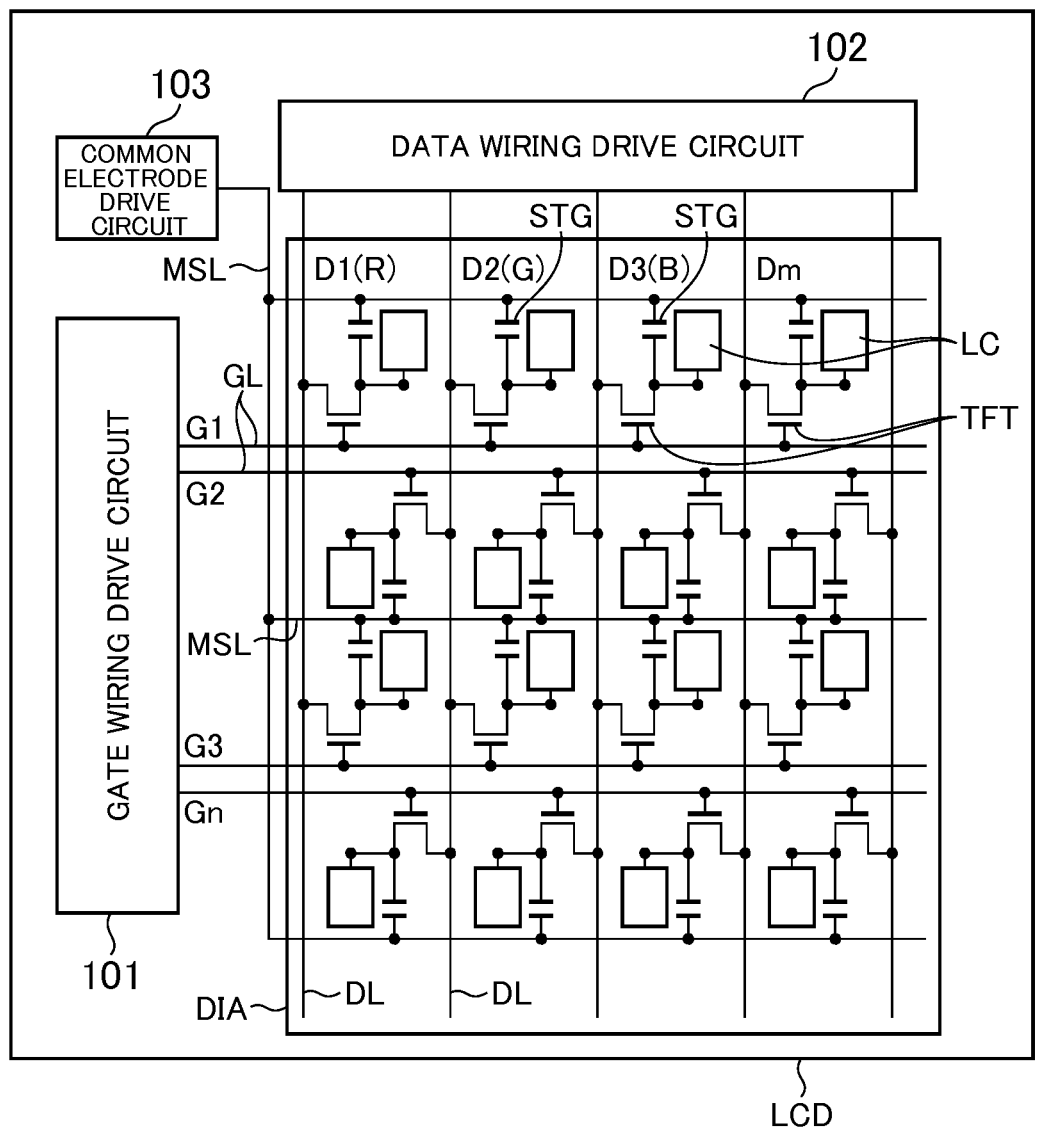
FIG. 1 is a diagram schematically illustrating a display device according to a first embodiment of the present application.

Embodiments of the present application will be described below with reference to drawings. In the drawings, the same or similar elements are identified with same symbols, and their description will not be repeated.

[First Embodiment]

FIG. 1 is a diagram schematically illustrating a display device according to a first embodiment of the present application. As shown in FIG. 1, the display device LCD includes a gate wiring drive circuit 101, a data wiring drive circuit 102, a common electrode drive circuit 103 and a pixel region DIA.

A gate voltage is supplied from the gate wiring drive circuit 101 through gate wirings G1, G2, . . . and Gn and a video data voltage is supplied from the data wiring drive circuit 102 through data wirings D1, D2, . . . and Dm to the pixel region DIA as an active matrix display. Then, a thin film transistor TFT is turned on and off to feed a data voltage to a pixel electrode. Then, by an electric field between a common voltage supplied from the common electrode drive circuit 103 and the data voltage, a liquid crystal layer LC is driven.

In order to prevent a voltage drop in the liquid crystal layer LC, a retention capacity STG is formed in each pixel region. The supply of the common voltage is transmitted to a common electrode wring MSL connected to the common electrode drive circuit 103, and is propagated to the pixel region DIA with a transparent common electrode CT.

When a color display is performed, it is realized by applying the desired data voltage to the data wirings D1 (R), D2 (G) and D3 (B) connected to the pixels of red (R), green (G) and blue (B), which are formed with a vertical striped color filter.

In the present embodiment, in the pixel arrangement of the active matrix, two gate wirings for vertically placed two pixels are arranged parallel to each other, and one common electrode wring MSL is shared by the vertically placed two pixels. With respect to the video data, in an odd-numbered row, the data voltage is supplied from the data wiring on the left side of the pixels, and in an even-numbered row, the data voltage is supplied from the data wiring on the right side of the pixels, and the pixels are arranged zigzag.

As described above, the two gate wirings are arranged side by side, and the common electrode wring MSL is shared by the vertically placed two pixels, and thus the aperture ratio is enhanced as compared with a case where the common electrode wring MSL is arranged individually.

When for a one-screen selection period, the data voltage, which is positive with respect to the common voltage, is applied to the data wiring D1, and, the data voltage, which is negative, is applied to the data wiring D2, since the relationship between the thin film transistor TFTs and the data wirings DL is in a zigzag arrangement, the polarity of the pixel electrodes in one column is alternated between positive and negative on an individual row basis. In this way, for the one-screen selection period, the voltage per data wiring has the same polarity, and thus it is possible to perform a driving method in which the variation in data and power consumption are low. Within the screen, positive and negative pixel potentials are dispersed, and thus it is possible to display with a satisfactory image quality and to reduce flicker. The configuration of the display device described above is one example, and the present embodiment is not limited to this configuration.

Figure 2:
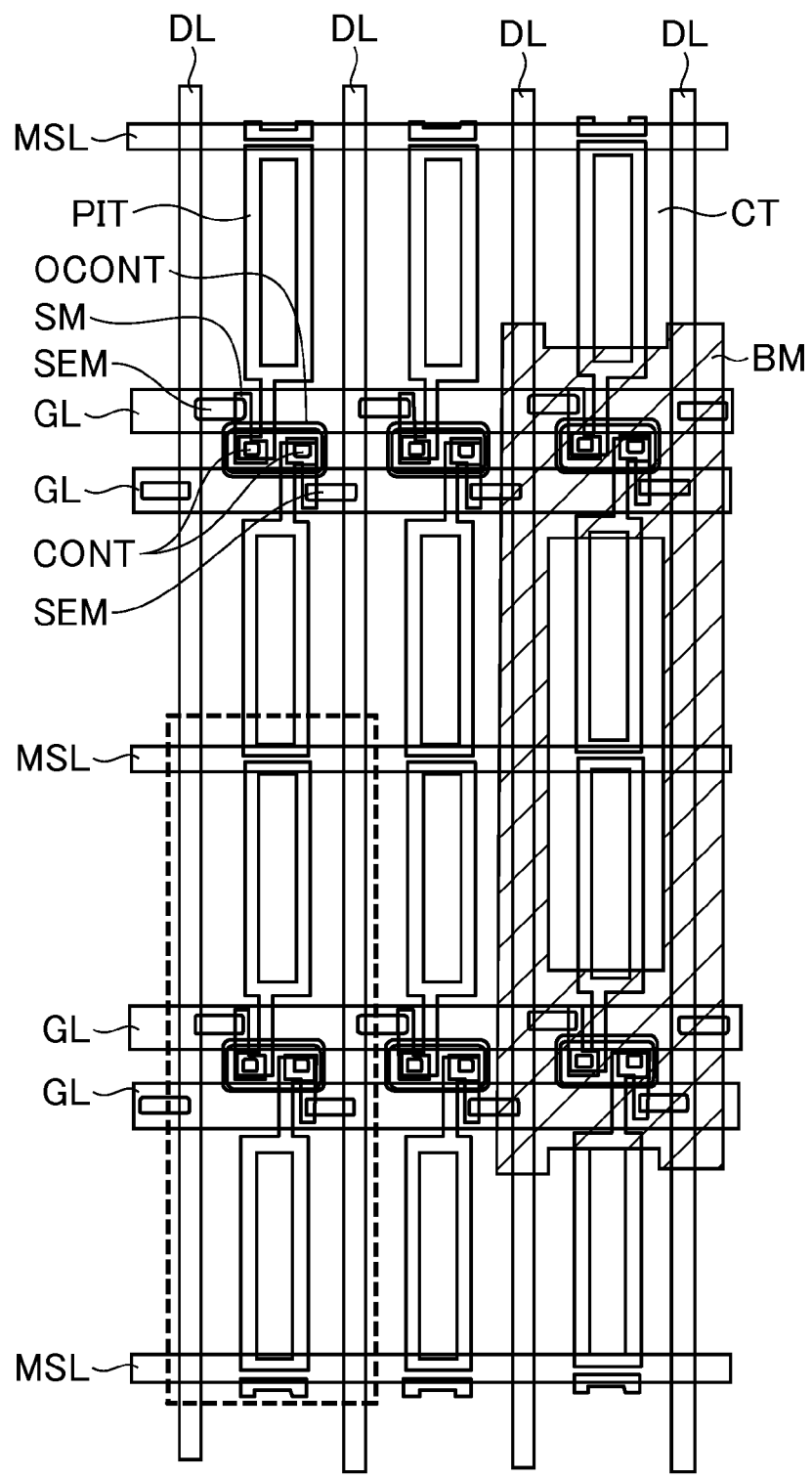
FIG. 2 shows an example of a plan view of a plurality of pixels shown in FIG. 1.
Figure 3:
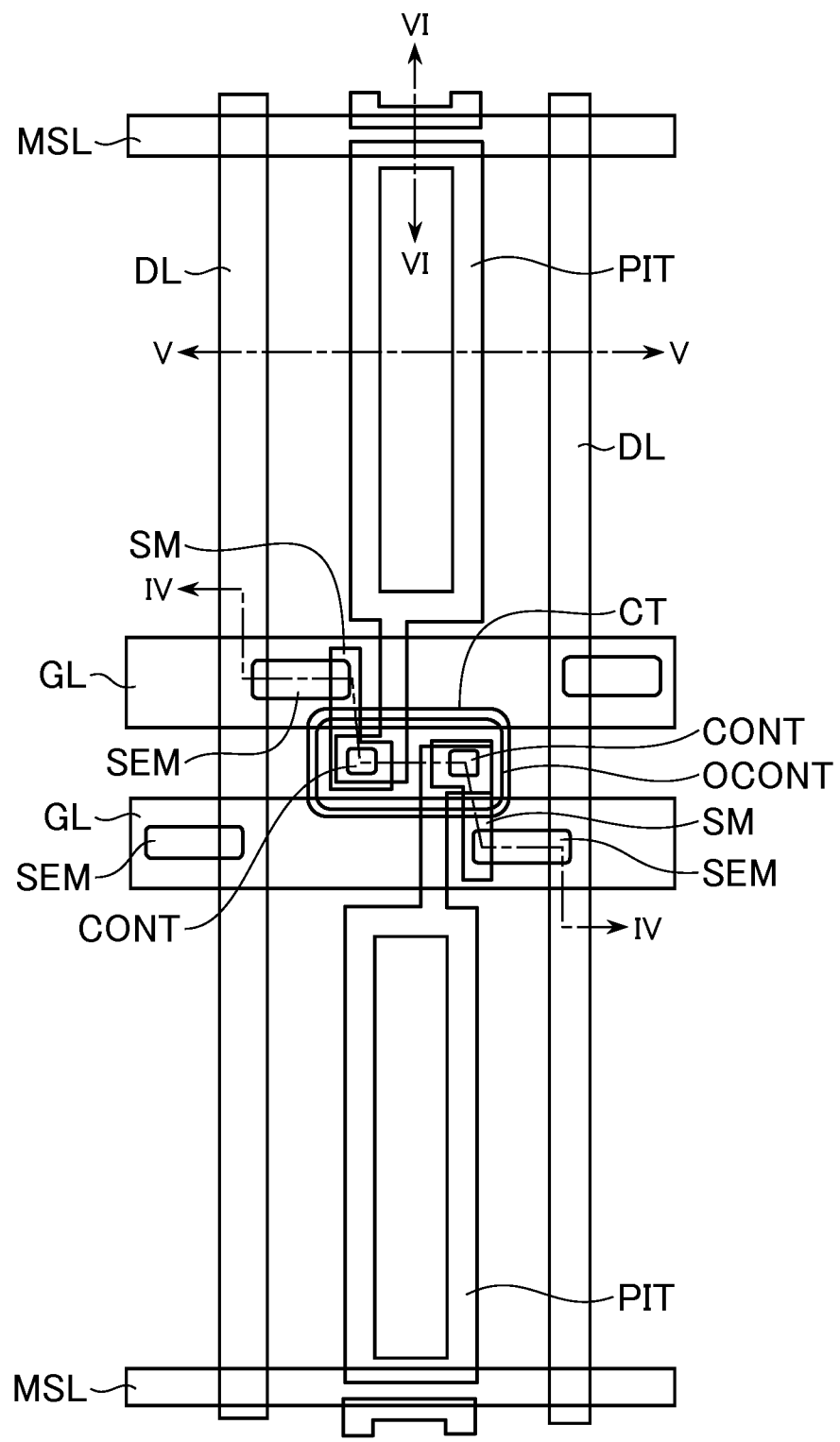
FIG. 3 is an enlarged view of one pixel shown in FIG. 2.

FIG. 2 shows an example of a plan view of a plurality of pixels shown in FIG. 1. FIG. 2 specifically shows an example of a plan view in which three pixels in the horizontal direction and four pixels in the vertical direction, that is, 12 pixels are extracted from the display device shown in FIG. 1. FIG. 3 is an enlarged view of one pixel shown in FIG. 2, and FIG. 4 shows an example of a cross-sectional view taken along line IV-IV of FIG. 3. FIG. 5 shows an example of a cross-sectional view taken along line V-V of FIG. 2, and FIG. 6 shows an example of a cross-sectional view taken along line VI-V1 of FIG. 2.

The gate wiring GL is a wiring that supplies the gate voltage to the thin film transistor TFT, and the data wiring DL is a wiring that supplies a video voltage to the thin film transistor TFT. The common electrode wiring MSL supplies a common potential to the transparent common electrode CT.

In two of a plurality of pixels shown in FIG. 2, a black matrix BM formed with a first substrate SUB1 is shown as an example. The data wiring DL, the gate wiring GL and the thin film transistor TFT are blocked by the black matrix BM having a light shielding effect from the upper surface. The black matrix BM has an aperture portion in its center. Thus, the size (aperture ratio) of the aperture portion in one pixel is increased, and it is possible to realize the display device that is bright and has low power consumption.

In the present embodiment, as shown in FIG. 2, vertically placed two pixels share one common electrode wiring MSL. In the boundary between the vertically placed two pixels, only the common electrode wiring MSL is disposed, the black matrix BM is not arranged, and the common electrode wiring MSL itself shields light. Hence, the variation of the aperture ratio based on placing the upper substrate on the lower substrate is reduced, so that the aperture ratio of each pixel is enhanced.

FIG. 3 is an enlarged view of vertically adjacent two pixels sandwiching two gate wirings GL in FIG. 2.

The gate wiring GL is formed with a low-resistant metal layer, and is connected to the gate wiring drive circuit 101 shown in FIG. 1. On the other hand, the data wiring DL is also formed with a low-resistant metal layer, and a data voltage for video is applied.

When a gate-on voltage is supplied to the gate wiring GL, the resistance of the semiconductor layer SEM of the thin film transistor is lowered. Thus, the voltage of the data wiring DL is transmitted to a source electrode SM formed with a low-resistant metal layer, and is transmitted to a transparent pixel electrode PIT connected to the source electrode SM. Here, the transparent pixel electrode PIT is formed with a first transparent electrode material ITO1.

The common voltage that is another voltage applied to the liquid crystal layer LC is applied from the common electrode drive circuit 103 of FIG. 1 through the common electrode wiring MSL to the transparent common electrode CT. The transparent common electrode CT is formed with a second transparent electrode material ITO2. The transparent pixel electrode PIT and the transparent common electrode CT are stacked in layers through an insulting film. Furthermore, in the transparent pixel electrode PIT within the display region of one pixel, a slit is formed. In the slit, the electric field of the transparent pixel electrode PIT is applied from the upper surface for the liquid crystal driving to the liquid crystal layer LC, and this electric field reaches the transparent common electrode CT to produce a display.

The source electrode SM is connected to the transparent pixel electrode PIT through a pixel electrode contact hole CONT formed at a protective film PAS. For each of the transparent pixel electrodes PIT of the vertically placed two pixels, the pixel electrode contact hole CONT is formed. On the other hand, on the outside of the two pixel electrode contact holes CONT, an organic film contact hole OCONT of an organic protective film OPAS is formed. The positions and the like of the organic film contact hole OCONT and the pixel electrode contact hole CONT will be described in detail later.

As described above, one organic film contact hole OCONT is shared by two pixels. By this sharing, it is possible to increase the aperture ratio of the pixel and thereby supply the display device LCD that is bright and has low power consumption.

The organic film contact hole OCONT is an aperture portion outline that is formed at the organic protective film OPAS. The organic protective film OPAS is formed of, for example, a photosensitive resist material. Its thickness at the time of application is, for example, 3 µm, and it is formed to be thick as compared with other insulting films and the like. Although the organic protective film OPAS is opened by development processing in an exposure step, since its thickness is great, it is difficult to open it with a small pattern dimension. Hence, when the organic film contact hole is formed in each pixel, the aperture ratio of the pixel is reduced.

Hence, in the present embodiment, the source electrodes SM of adjacent pixels are arranged adjacently, and the organic film contact hole OCONT is formed to surround them. Thus, it is possible to improve the aperture ratio and provide the display device LCD that is bright and has low power consumption. As described above, the two gate wirings GL are arranged side by side, and the pixel arrangement of the staggered arrangement is formed in which the column of the thin film transistors TFTs where the data voltage is supplied from the data wiring DL on the left side and the column of the thin film transistors TFTs where the data voltage is supplied from the data wiring DL on the right side are alternated on an individual row basis, so that it is possible to arrange two source electrodes SM laterally and in a compact manner. In this way, it is possible to reduce the side of the organic film contact hole OCONT itself.

An example of the configuration of the cross-section of the display device according to the present embodiment will now be described. FIG. 4 is a diagram showing an example of a cross-sectional view taken along line IV-IV of FIG. 3. The cross-sectional configuration is the structure of a route in which, when for the semiconductor layers SEM of the two pixels, a data potential is supplied from the data wiring DL and an on-voltage is applied to the gate wiring GL, the resistance of the semiconductor layers SEM is lowered, and this is transmitted from the source electrode SM to the transparent pixel electrode PIT and is accumulated in the retention capacity STG and the capacity of the liquid crystal layer LC.

As shown in FIG. 4, two pixel electrode contact holes CONT for connection from the two source electrodes SM of adjacent two thin film transistors TFTs to the transparent pixel electrode PIT are formed within the organic film contact hole OCONT formed at the outside thereof. The pixel electrode contact hole CONT is formed on a stacked layer of an upper layer insulting film UINS formed with, for example, a silicon nitride and the protective film PAS. As compared with the organic film contact hole OCONT formed at the organic protective film OPAS, the pixel electrode contact hole CONT can be processed to be narrow and have small dimensions.

On the other hand, the organic film contact hole OCONT is formed at the organic protective film OPAS of the thick photosensitive resist. As described above, since the organic film contact hole OCONT cannot be processed so as to have small dimensions, the organic film contact hole OCONT is formed into one so as to surround the two small pixel electrode contact holes CONT. Thus, it is possible to enhance the aperture ratio.

Here, the liquid crystal layer LC is sandwiched between the first substrate SUB1 and a second substrate SUB2 that are two transparent substrates. The liquid crystal layer LC is filled with a positive liquid crystal in which the longitudinal axes of liquid crystal molecules are aligned along the direction of an electric field. The thickness of the liquid crystal layer LC is, for example, 3 to 4 μm.

The first substrate SUB1 and the second substrate SUB2 are formed of, for example, glass. Although the thickness of the first substrate SUB1 and the second substrate SUB2 is, for example, 0.4 to 0.7 mm in a manufacturing process, they are finally chemically polished after the formation of the first and second transparent substrates in which the liquid crystal layer LC is sealed, and the thickness may be so thin as to be, for example, about 0.2 mm. As the material of the first substrate SUB1 and the second substrate SUB2, plastic or the like may be used instead of glass.

A first polarization plate POL and a second polarization plate POL are adhered to the outside of the first substrate SUB1 and the second substrate SUB2. Hence, light from a backlight outside the second polarization plate POL is polarized, the light is thereafter passed through the liquid crystal and the light is formed into oval polarized light by the optical birefringence effect of the liquid crystal layer LC. Thereafter, when the light passes through the first polarization plate POL on the outside of the first substrate SUB1, the light passes through it as linear polarized light.

In the present embodiment, for example, the first polarization plate POL and the second polarization plate POL are adhered such that their polarizing axes are perpendicular to each other (so-called cross Nikos). Hence, when the liquid crystal is not in an electric field, even if the light of the backlight passes through the liquid crystal layer LC, the first polarization plate POL interrupts the light, and thus it is possible to produce a black display. When a voltage is mainly applied between the transparent pixel electrode PIT and the transparent common electrode CT to apply an electric field to the liquid crystal layer LC, the liquid crystal layer LC converts the light into oval polarized light by a birefringence operation, and thus it is possible to change its transmittance according to its drive voltage, with result that it is possible to produce a white display with a gray-scale display.

On both sides of the liquid crystal layer, a first alignment film AL and a second alignment film AL that can fix the liquid crystal molecules thereto are formed. The alignment film AL is mainly formed of, for example, polyimide. As a method of aligning the liquid crystal molecules on the surfaces, for example, a method of performing rubbing or applying polarized ultraviolet rays is preferably used.

A color display is realized by passing light through a color filter CF in which a pigment formed on the first substrate SUB1 is used as a coloring layer. Since the pigment melts into the liquid crystal to become a contaminating source, its surface is coated with an overcoat film OC that is an organic material. The overcoat film OC also has the effect of making the surface flat.

Depending on the type of semiconductor layer SEM, when external light directly illuminates the semiconductor layer SEM, the resistance of the semiconductor layer SEM is lowered, and thus the retaining property of the display device is lowered, with the result that a satisfactory image display may not be realized. Hence, the black matrix BM is formed on the upper surface of the semiconductor layer SEM of the first substrate SUB1.

The black matrix BM is also arranged in the boundary between the pixels of the color filter CF, and has the effect of preventing the mixing of colors caused by the oblique viewing of the light of adjacent pixels and of displaying an image without being smeared.

However, when the width of the black matrix BM is excessively increased, the aperture ratio and the transmittance are reduced. Hence, in order for a high-definition display device to be bright and to have low power consumption, it is necessary to achieve such a minimum width that the mixing of colors caused by oblique viewing is prevented. The black matrix BM is formed of, for example, a resin material or a metallic material using a black pigment.

As described with reference to FIG. 3, within one pixel, the drive voltage is applied to the transparent pixel electrode PIT in a case where the liquid crystal layer LC is regarded as a capacitor. The on-voltage is first applied the gate wiring GL formed with a metal layer. The gate wiring GL is formed of, for example, a metallic material having, as a main component, aluminum Al, molybdenum Mo, titanium Ti or copper Cu, a plurality of stacked layers described above, an ally in which tungsten W, magnesium Mn or the like is added to the metallic material described above or a stacked metal layer formed by a combination of those described above. Its thickness is, for example, 100 to 300 nm.

On the upper portion of the gate wiring GL, a gate insulting film GSN is formed. As the gate insulting film GSN, for example, a silicon nitride formed with a plasma chemical vapor deposition method (CVD) is used. The gate insulting film GSN may be formed of silicon dioxide $SiO_2$ or alumina $Al_2O_3$.

On the gate wiring GL, the semiconductor layer SEM is processed into the shape of an island and is arranged. As the semiconductor layer material, for example, a combination of a silicon nitride and amorphous silicon a-Si, a combination of silicon dioxide and an oxide semiconductor or a low-temperature poly-silicon LIPS is used. For example, as the oxide semiconductor, an oxide of indium-gallium-zinc or the like is used.

At the end portions of the semiconductor layer SEM, the data wiring DL and the source electrode SM are formed. As the data wiring DL and the source electrode SM, for example, as described later, a low-resistant metallic material formed in the same step is used. As the metallic material, for example, a metallic material having, as a main component, aluminum Al, molybdenum Mo, titanium Ti or copper Cu, a plurality of stacked layers described above, an ally in which tungsten W, magnesium Mn or the like is added to the metallic material described above or a stacked metal layer formed by a combination of those described above is used.

The transparent pixel electrode PIT is connected onto the source electrode SM. The transparent pixel electrode PIT has a plurality of aperture portions (slits) within, for example, one-pixel region divided by the gate wirings GL and the data wirings DL arranged in a matrix. With respect to the supply of the data voltage to the transparent pixel electrode PIT, when the on-voltage is applied to the gate wiring GL, the resistance of the semiconductor layer SEM is lowered, and the data voltage is transmitted from the data wiring DL through the source electrode SM to the transparent pixel electrode PIT. Then, the voltage described above is charged in the capacity of the transparent pixel electrode PIT and the transparent common electrode CT.

On the data wiring DL and the source electrode SM, the protective insulating film PAS is formed. As the protective insulting film PAS, for example, a silicon nitride or silicon dioxide is used. Its thickness is, for example, 200 to 400 nm.

The protective film PAS is coated with the organic protective film OPAS. In the organic protective film OPAS described above, the organic film contact hole OCONT is formed. As the organic protective film OPAS described above, for example, a photosensitive resist having a thickness of 3 µm is used. Its material is, for example, acrylic. Since the organic protective film OPAS itself is photosensitive, the organic film contact hole OCONT can be opened and processed by exposure and development processing in the exposure step using a photo mask. Since the organic film contact hole OCONT is about 10 times as thick as the protective film PAS of a silicon nitride, and its exposure sensitivity is lower than that of a normal photo resist, it is impossible to form a small aperture portion. Hence, in the present embodiment, two pixel electrode contact holes CONT in two pixels are arranged, and the organic film contact hole OCONT is provided on the outside thereof, and thus the aperture ratio is enhanced.

On the organic protective film OPAS, the transparent common electrode CT is formed. The transparent common electrode CT is formed with, for example, the material of an indium-tin-oxide or an indium-zinc-oxide. On the transparent common electrode CT, for example, the upper portion insulting film UINS formed of silicon nitride or silicon dioxide is formed. As with the transparent common electrode CT, the transparent pixel electrode PIT is formed of transparent electrode material such as an indium-tin-oxide, and is connected to the source electrode SM through the pixel electrode contact hole CONT formed at the upper portion insulting film UINS.

FIG. 5 is a diagram showing an example of a cross-sectional view taken along line V-V of FIG. 3. Specifically, FIG. 5 shows a cross-sectional view of a pixel sandwiched between two data wirings DL, and also shows a cross-sectional view of the adjacent pixel.

The pixel located in the center of FIG. 5 corresponds to the color filter CF (G) of green G in the vertically striped color filter CF arrangement. The left and right thereof correspond to the color filter CF (R) of red and the color filter CF (B) of blue.

In the boundary between the pixels in which the data wiring DL exists, the black matrix BM is formed on the inner surface of the first substrate SUB1, sandwiching the liquid crystal layer LC. The data wiring DL and the black matrix BM described above prevent the mixing of colors caused by viewing the light of the backlight of the adjacent pixel by transmission when the pixel divided by the color filter CF is obliquely viewed.

Although not shown in the figure, the light of the backlight is applied to the second substrate from the outside of the polarization plate adhered to the outside of the second substrate SUB2. However, when the width of the data wiring DL and the black matrix BM is increased, the aperture ratio and the transmittance are lowered, with the result that disadvantageously, the display device is dimmed or the power consumption is increased. In particular, since in a high-definition display device, such a problem is remarkable, a display device is desired in which the black matrix BM and the data wiring DL are decreased in width and in which a display failure is unlikely to occur.

As shown in FIG. 5, division into two regions, that is, a boundary region of the pixels of the black matrix BM or the data wiring DL which does not pass through light and an aperture region which passes through light is performed. The structure and the operation of the aperture region will first be described.

In the aperture region, the video data voltage and the common voltage are applied between the transparent pixel electrode PIT and the transparent common electrode CT, an electric field between these electrodes is applied to the liquid crystal layer LC and the oval polarization intensity of the liquid crystal layer LC is changed by its electric field intensity to control the transmittance, with the result that a gray-scale display is produced. On the transparent second substrate SUB2, the transparent pixel electrode PIT and the transparent common electrode CT are formed, and the electric field applied between these two electrodes is propagated and thus the liquid crystal molecules LCM are rotated horizontally to perform gray-scale control, with the result that the display device of so-called in-plane switching (IPS) is achieved. A setting is performed such that when the maximum voltage is applied between the two electrodes, the transmittance of the display device is maximized. When the potential difference between the transparent pixel electrode PIT and the transparent common electrode CT is decreased, the transmittance is lowered, with the result that a black display is produced. The transmittance is increased such that the potential difference is maximized, and thus a white display is produced. The maximum transmittance when the maximum voltage is applied may be simply expressed as the transmittance.

The liquid crystal layer LC is filled with, for example, the liquid crystal molecules LCM of organic material. On the surfaces of the alignment film. AL1 formed on the inner surface of the first substrate SUB1 and the alignment film AL2 formed on the inner surface of the second substrate SUB2, the longitudinal axes of the liquid crystal molecules LCM are fixed by alignment processing. Electric lines of force by such an electric field as to be returned through the upper insulating film UINS to the liquid crystal layer LC when the voltage between the two electrodes, that is, the transparent pixel electrode PIT and the transparent common electrode CT is increased are formed from the aperture portion.

FIG. 6 is a diagram showing an example of a cross-sectional view taken along line VI-V1 of FIG. 3. In the electric field extending from the transparent pixel electrode PIT to the transparent common electrode CT through the liquid crystal layer LC and the upper insulting film UINS, the common electrode wiring MSL is arranged in the center of the adjacent pixels for driving the liquid crystal layer LC.

The common electrode wiring MSL uses the low-resistant wiring material to reduce a wiring delay in the transparent common electrode CT. Hence, the common electrode wiring MSL is connected to the transparent common electrode CT.

The common electrode wiring MSL is formed of, for example, a metallic material having, as a main component, aluminum Al, molybdenum Mo, titanium Ti or copper Cu, a plurality of stacked layers described above, an ally in which tungsten W, magnesium Mn or the like is added to the metallic material described above or a stacked metal layer formed by a combination of those described above. Its thickness is, for example, 50 to 200 nm.

The common electrode wiring MSL is arranged so as to be directly connected onto the transparent common electrode in which the organic protective film OPAS is coated, over a plurality of pixels, with the data wiring DL and the gate wiring GL. Furthermore, between vertically placed pixels, its arrangement is shared by one region. Thus, as compared with a method in which the common electrode wiring MSL is arranged per pixel, since the arrangement can be performed without the wiring width being changed, it is possible to enhance the aperture ratio. Since the common electrode wiring MSL is formed of opaque material, it is possible to divide the boundary between the pixels without arranging the black matrix BM on the first substrate SUB1. Since in general, the accuracy of locating the first substrate SUB1 and the second substrate SUB2 vertically placed is low, when the black matrix BM is not necessary, the aperture ratio can be improved.

A method of manufacturing the display device according to the present embodiment will now be described. FIGS. 7 to 13 are diagrams for illustrating the method of manufacturing the display device according to the present embodiment. FIGS. 7A to 13A correspond to the steps of the plan view of FIG. 3, and FIGS. 7B to 13B show the corresponding cross-sectional views of FIGS. 7A to 13A.

Figure 7A:
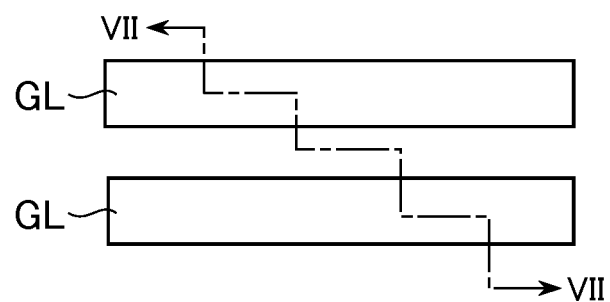
FIG. 7A is a diagram for illustrating a method of manufacturing a display device according to a first embodiment of the present application.
Figure 7B:
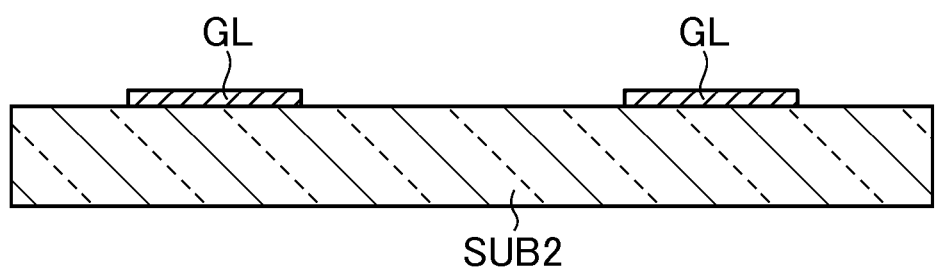
FIG. 7B is a diagram for illustrating a method of manufacturing a display device according to a first embodiment of the present application.

FIG. 7A shows a plan view of the vertically adjacent two pixels of FIG. 3 after the completion of the first photo-step of the thin film transistor TFT. FIG. 7B shows a cross-sectional view taken along line VII-V11 of FIG. 7A. The adjacent gate wirings GL are formed into a film by sputtering on the first substrate, and are patterned in the first photo-step. The gate wiring GL is a stacked film in which, for example, molybdenum Mo is formed into a film on the copper of 100 nm to 300 nm. As the wiring material, for example, not only copper Cu but also a stacked film of molybdenum Mo and aluminum Al, a stacked film of titanium Ti and aluminum Al, an alloy MoW of molybdenum Mo and tungsten W and the like can be used.

Figure 8A:
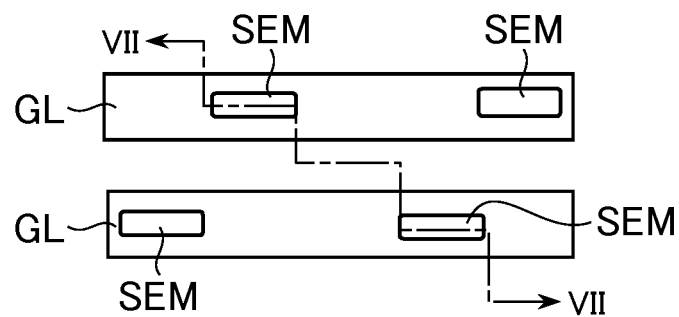
FIG. 8A is a diagram for illustrating a method of manufacturing a display device according to a first embodiment of the present application.
Figure 8B:
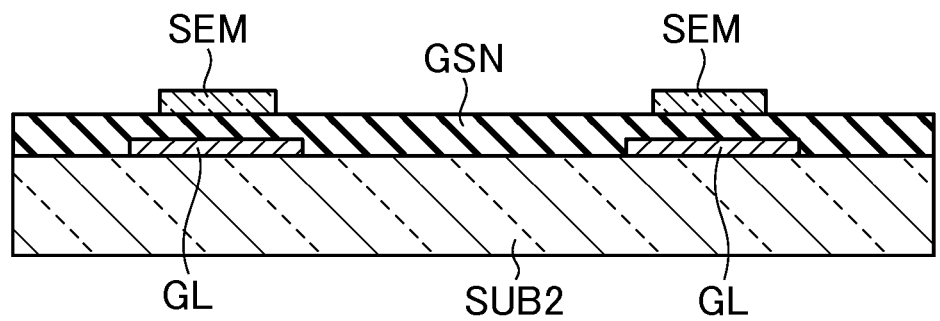
FIG. 8B is a diagram for illustrating a method of manufacturing a display device according to a first embodiment of the present application.

FIGS. 8A and 8B show a plan view and a cross-sectional view when a second photo-step is completed. As shown in FIGS. 8A and 8B, for example, on the gate wiring GL, the gate insulting film GSN of silicon nitride and the semiconductor layer SEM of amorphous silicon are stacked in layers by CVD. The thickness of the gate insulting film GSN and the semiconductor layer SEM are, for example, about 400 nm and 200 nm, respectively. Then, a photoresist is formed from the upper portion of the CVD film described above, exposure is performed with a photo mask and thus the region of the semiconductor layer SEM is formed.

Figure 9A:
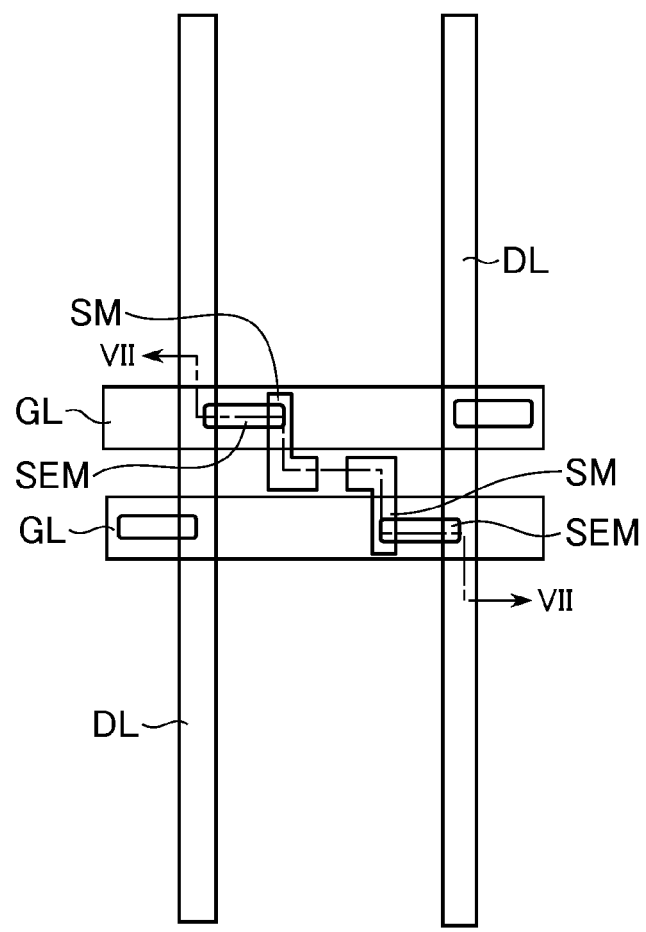
FIG. 9A is a diagram for illustrating a method of manufacturing a display device according to a first embodiment of the present application.
Figure 9B:
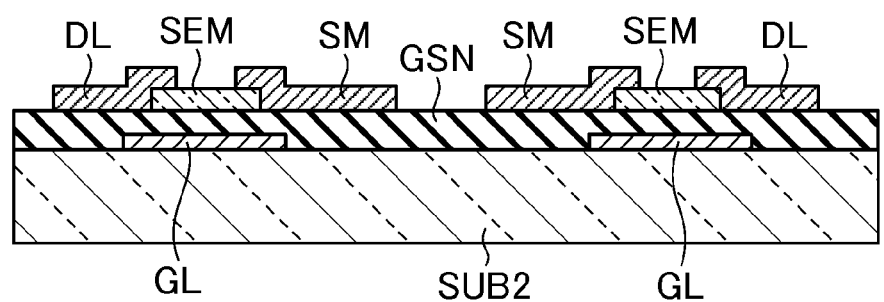
FIG. 9B is a diagram for illustrating a method of manufacturing a display device according to a first embodiment of the present application.

FIGS. 9A and 9B show a plan view and a cross-sectional view when a third photo-step is completed. As shown in FIGS. 9A and 9B, for example, on the upper portion of the semiconductor layer SEM, a stacked film of molybdenum Mo and copper Cu is formed by sputtering into a film. As the material of the stacked film, for example, as with the material of the gate wiring GL, a three-layer film of molybdenum Mo, aluminum Al and molybdenum Mo, a stacked film of titanium Ti and aluminum Al, an MoW alloy or the like can be used. Then, this is processed by the photo-step, and thus the regions of the data wiring DL and the source electrode SM are formed.

Figure 10A:
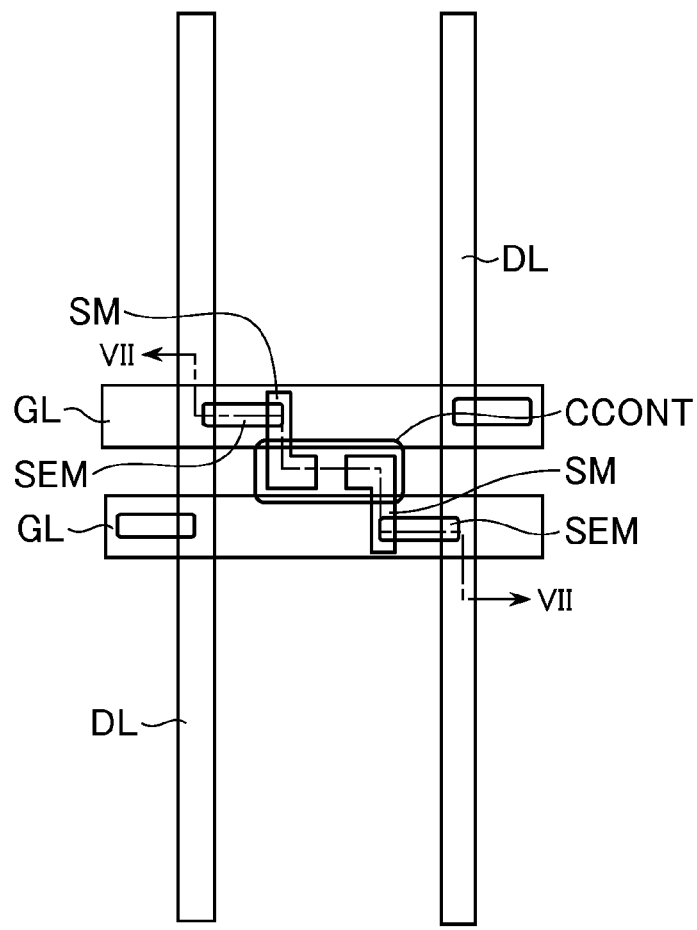
FIG. 10A is a diagram for illustrating a method of manufacturing a display device according to a first embodiment of the present application.
Figure 10B:
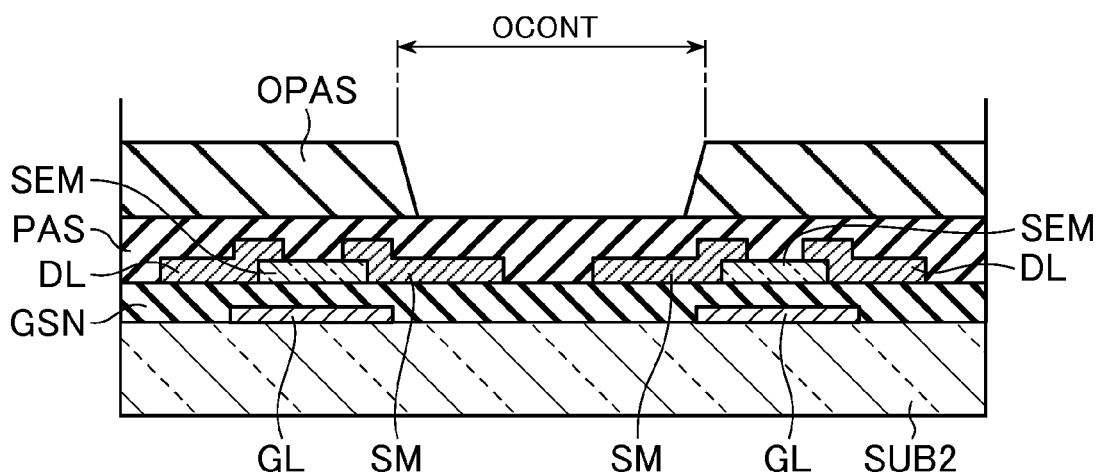
FIG. 10B is a diagram for illustrating a method of manufacturing a display device according to a first embodiment of the present application.

FIGS. 10A and 10B show a plan view and a cross-sectional view when a fourth photo-step is completed. As shown in FIGS. 10A and 10B, on the data wiring DL and the source electrode SM, the protective film. PAS is formed by CVD, and then the organic protective film OPAS of photosensitive acrylic is coated. The protective film PAS is formed of, for example, silicon nitride, and its thickness is, for example, 200 to 400 nm. Since the material of the photosensitive acrylic itself can be used as the photoresist in the photo-step, the aperture portion is formed on the source electrode SM with a photo mask by development processing.

The thickness of the organic protective film OPAS is, for example, 3000 nm (3 µm), and the organic protective film OPAS is thicker than the protective film PAS. This is because the organic protective film OPAS is a coated film. However, since the relative permittivity of the organic protective film OPAS is so low as to be 2 to 4, even when the organic protective film OPAS is formed on the data wiring DL, and the transparent common electrode CT is further formed on its upper portion over the entire surface of a plurality of pixel regions, it is possible to reduce the wiring capacity of the data wiring DL, to realize satisfactory image quality with little wiring delay and to reduce the power consumption for the drive. However, since the exposure sensitivity is lower than that of a normal photoresist, the pattern dimension of the aperture portion is increased, with the result that conversely, the aperture ratio is likely to be reduced. In the present embodiment, as described above, the organic film contact hole OCONT of the organic protective film OPAS is formed so as to surround the pixel electrode contact holes CONT of the thin film transistors TFTs over a plurality of pixel regions, and thus the aperture ratio is enhanced.

Figure 11A:
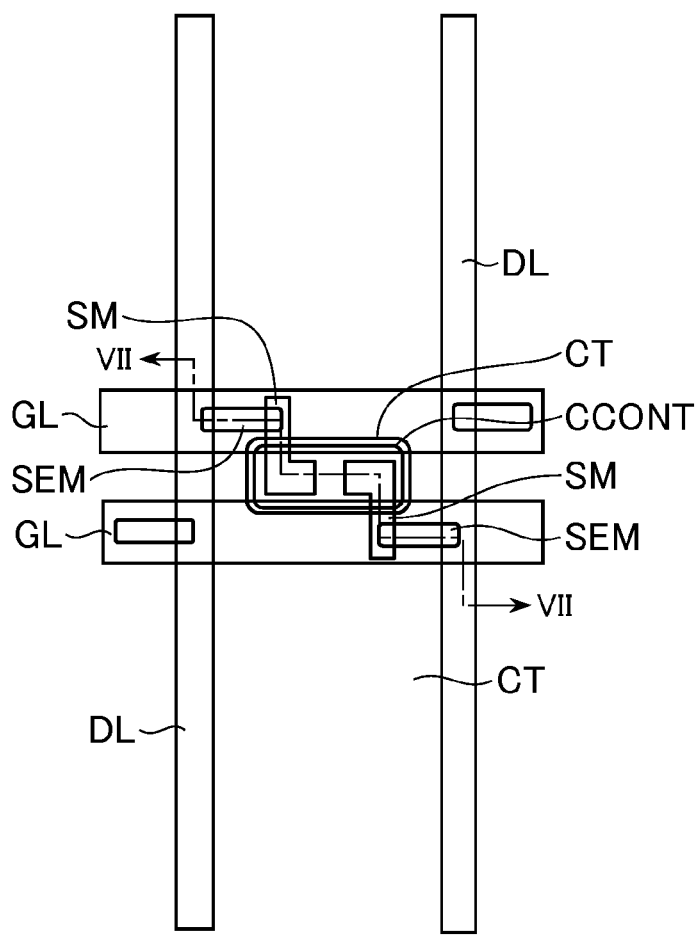
FIG. 11A is a diagram for illustrating a method of manufacturing a display device according to a first embodiment of the present application.
Figure 11B:
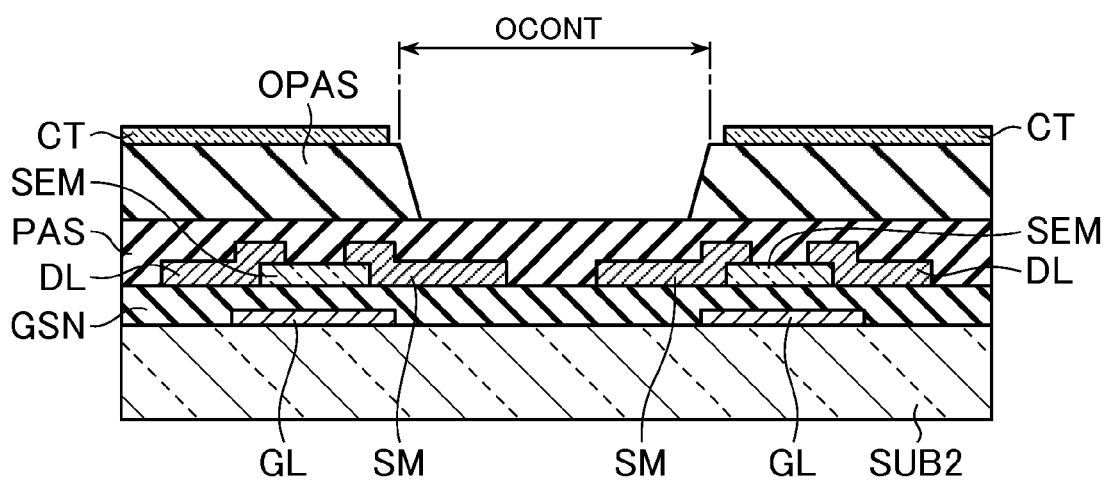
FIG. 11B is a diagram for illustrating a method of manufacturing a display device according to a first embodiment of the present application.

FIGS. 11A and 11B show a plan view and a cross-sectional view when a fifth photo-step is completed. As shown in FIGS. 11A and 11B, for example, a third transparent electrode material of indium-tin-oxide, which is a transparent electrode material, is formed into a film, and the transparent common electrode CT is formed on the organic protective film OPAS through a photo-etching step.

Figure 12A:
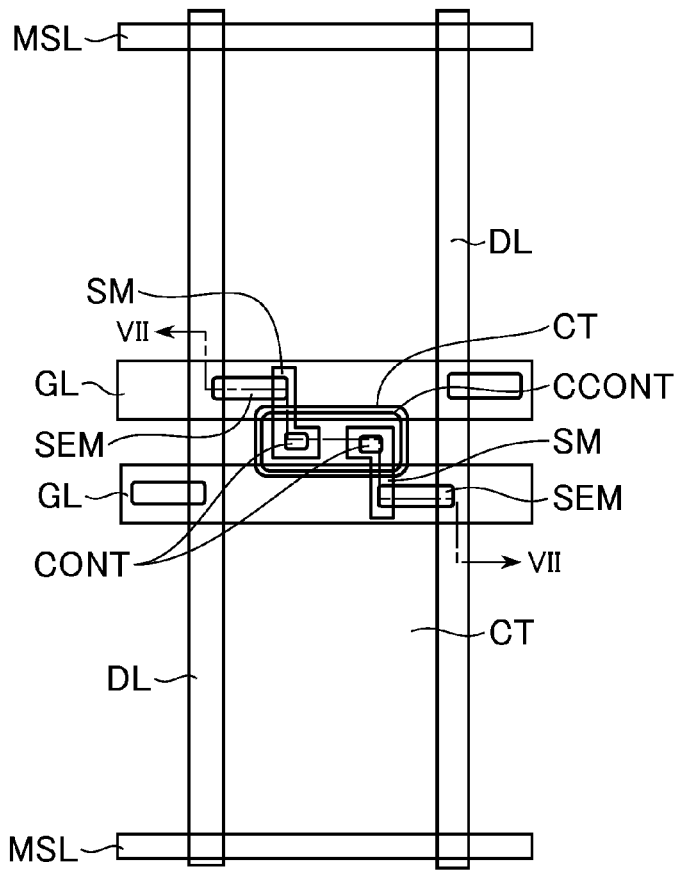
FIG. 12A is a diagram for illustrating a method of manufacturing a display device according to a first embodiment of the present application.
Figure 12B:
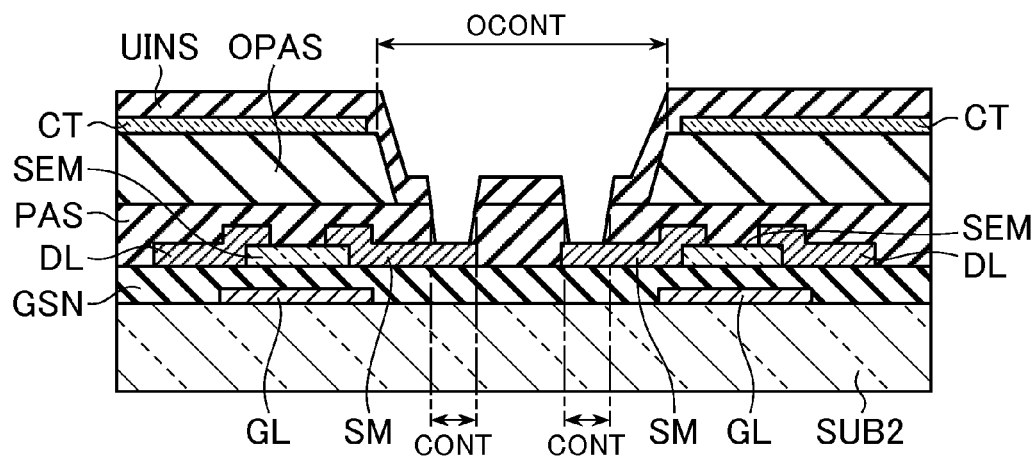
FIG. 12B is a diagram for illustrating a method of manufacturing a display device according to a first embodiment of the present application.

FIGS. 12A and 12B show a plan view and a cross-sectional view when a sixth photo-step is completed. As shown in FIGS. 12A and 12B, for example, the upper insulting film UINS is formed on the transparent common electrode CT by CVD. Then, the pixel electrode contact hole CONT, which is the aperture portion, is formed. The pixel electrode contact hole CONT is formed through the photo-step and a dry-etching step on the insulating film in which the protective film PAS and the upper insulting film UINS on the source electrode SM of the vertically placed pixels are stacked in layers.

Figure 13A:
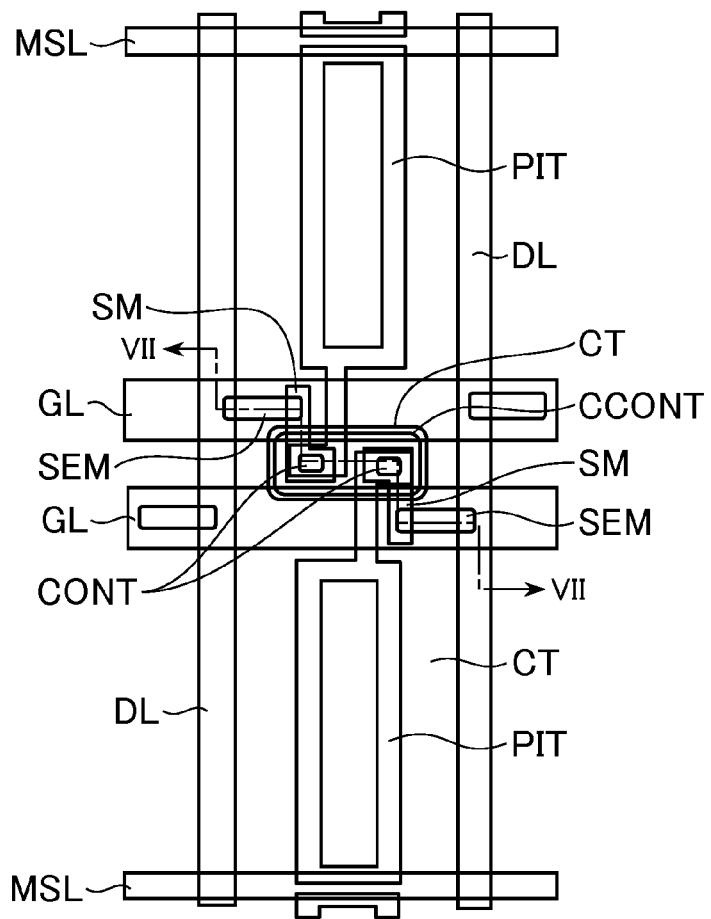
FIG. 13A is a diagram for illustrating a method of manufacturing a display device according to a first embodiment of the present application.
Figure 13B:
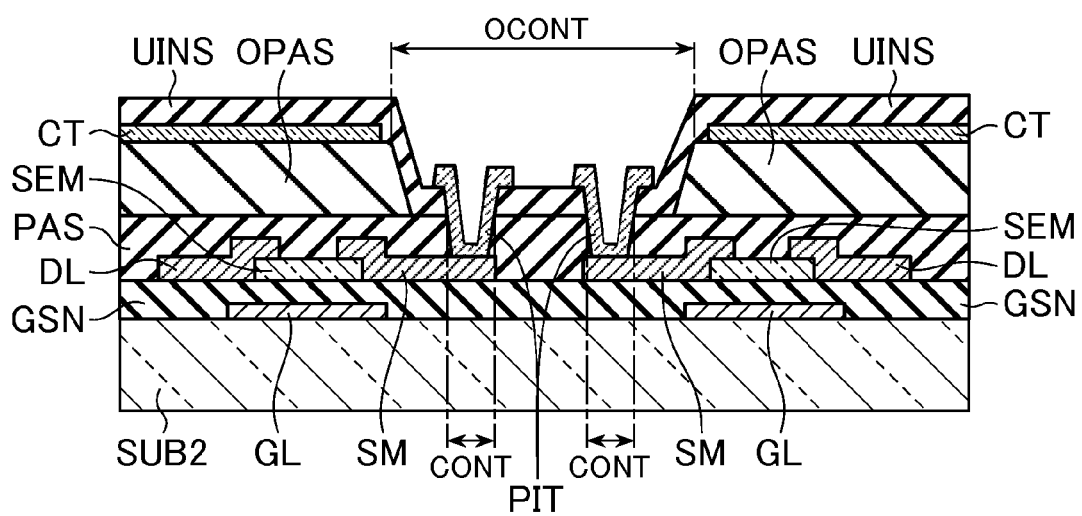
FIG. 13B is a diagram for illustrating a method of manufacturing a display device according to a first embodiment of the present application.

FIGS. 13A and 13B show a plan view and a cross-sectional view when a seventh photo-step is completed. As shown in FIGS. 13A and 13B, an indium-tin-oxide ITO1 that is the material of the transparent pixel electrode PIT is formed into a film, and then, the transparent pixel electrode PIT is formed by photo-etching.

The pixel electrode contact hole CONT that connects the transparent pixel electrode PIT and the source electrode SM is formed within the organic film contact hole OCONT of the organic protective film OPAS. A plurality of pixel electrode contact holes CONT are formed within the organic film contact hole OCONT, and thus the aperture ratio is enhanced.

As described above, it is possible to form the display device of the present embodiment. In the above description, only the steps of manufacturing the so-called TFT substrate (the second substrate SUB2) are discussed, and since the steps of manufacturing the color filter substrate (the first substrate SUB1) and the like are known, their description are omitted.

The present invention is not limited to the embodiment described above, and may be replaced with the substantially same configuration as that described in the embodiment, a configuration having the same effect of operation or a configuration that can achieve the same object.

[Second Embodiment]

Figure 14:
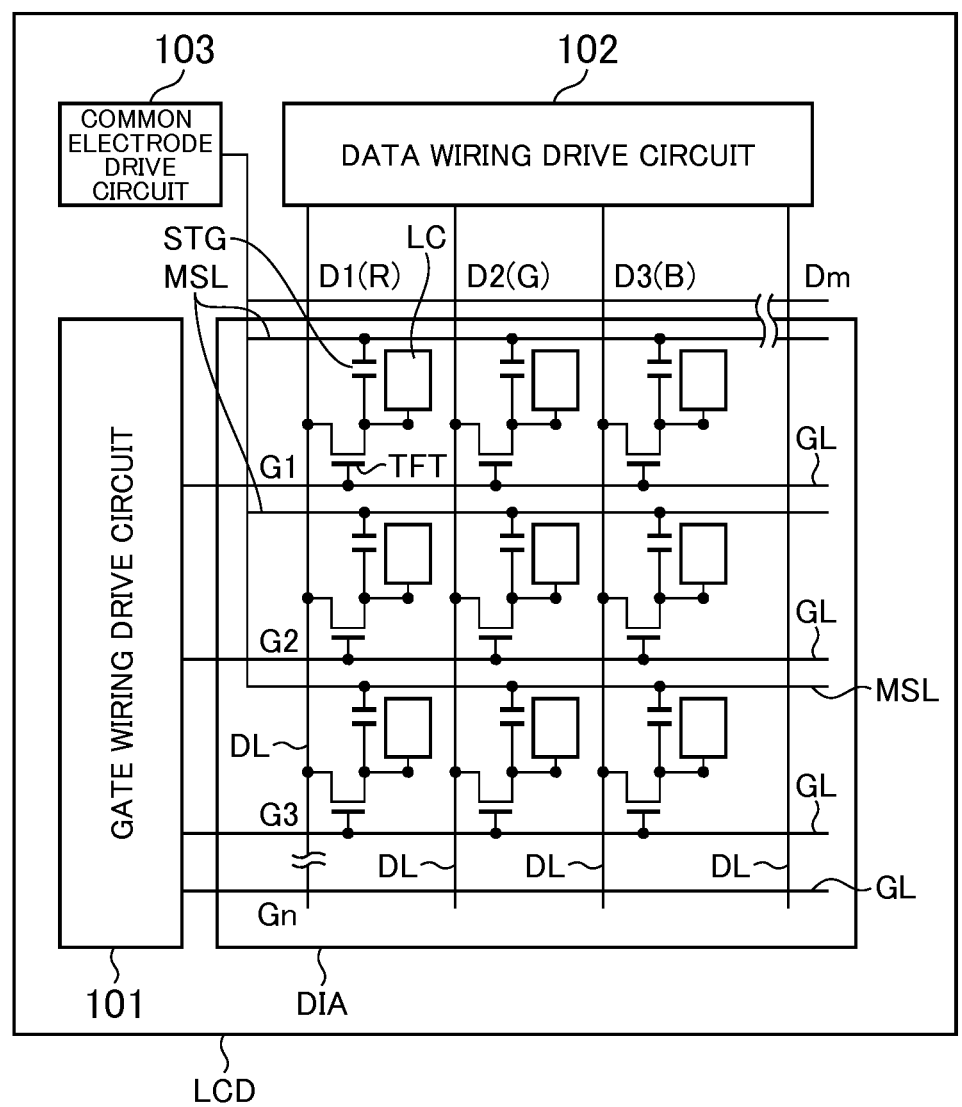
FIG. 14 is a diagram for illustrating a display device according to a second embodiment of the present application.

FIG. 14 is a diagram for illustrating a display device according to a second embodiment of the present application. As shown in FIG. 14, as in the first embodiment described above, the display device LCD includes the gate wiring drive circuit 101, the data wiring drive circuit 102, the common electrode drive circuit 103 and the pixel region DIA. The present embodiment mainly differs from the first embodiment in that the gate wirings are not arranged adjacently every two gate wirings, and that the common electrode wiring MSL is not shared.

As in the first embodiment, a scanning voltage is supplied from scanning (gate) wirings G1, G2, . . . and Gn and a video data voltage is supplied from data wirings D1, D2, . . . and Dn to the pixel region DIA. Then, the thin film transistor TFT is turned on and off to feed the data voltage to the liquid crystal layer LC, and an electric field between this and the common voltage drives the liquid crystal layer LC. In order to prevent a voltage drop in the liquid crystal layer LC, the retention capacity STG is formed in each pixel region. The supply of the common voltage is propagated to the screen region of the common electrode wiring MSL and the transparent common electrode CT connected thereto.

Figure 15:
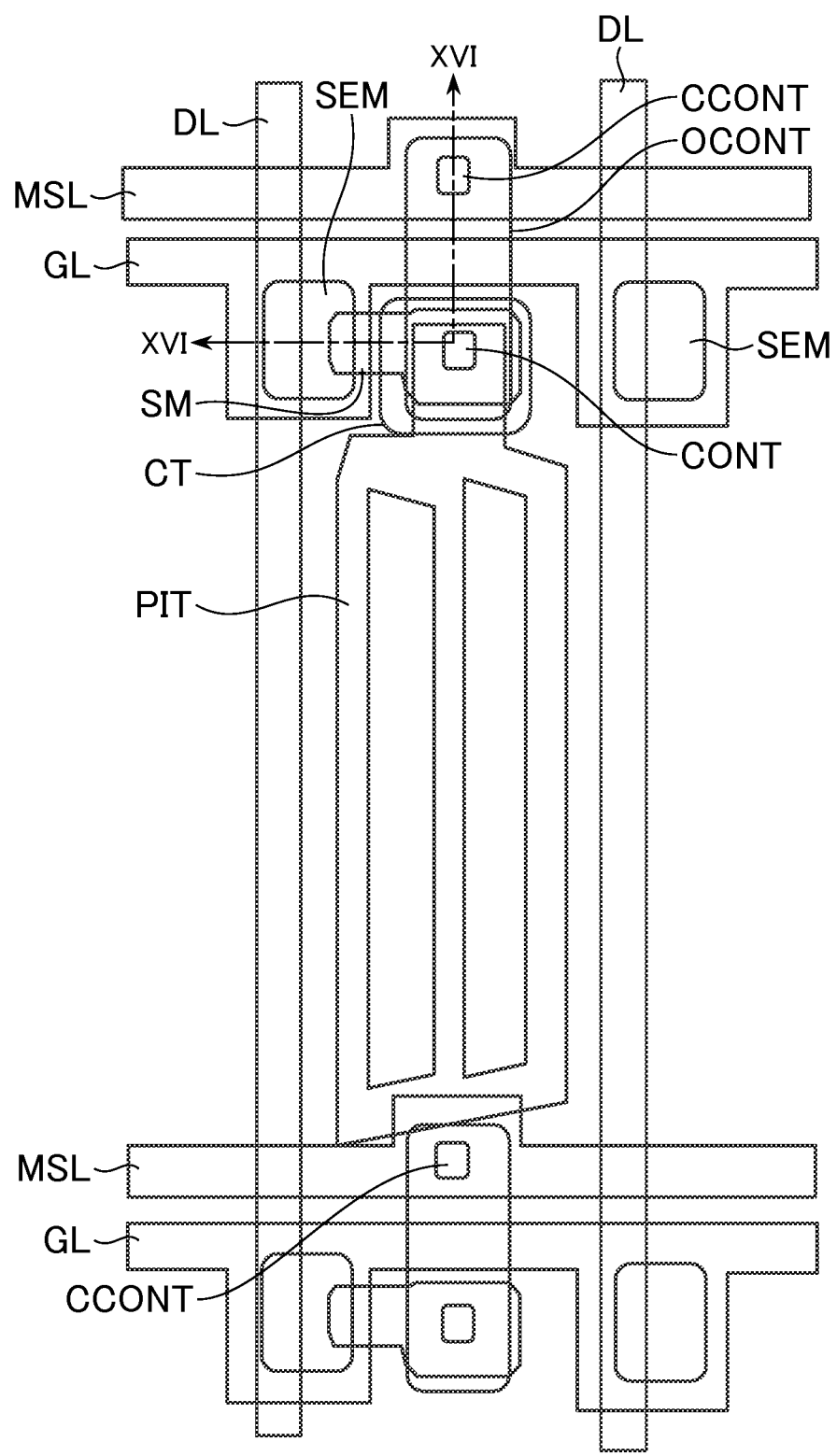
FIG. 15 is a plan view of a region of one pixel in FIG. 14 and a region including adjacent pixels.

FIG. 15 is a plan view of a region of one pixel surrounded by the thin film transistor TFT, the gate wiring GL and the data wiring DL in FIG. 14 and a region including adjacent pixels therearound.

As in the first embodiment, the gate wiring GL is formed with a low-resistant metal layer. The gate wiring GL is connected to the gate wiring drive circuit 101 of FIG. 14, and the scanning voltage is applied. On the other hand, the data wiring DL is also formed with a low-resistant metal layer. A data voltage for video is applied to the data wiring DL.

When a gate-on voltage is supplied to the gate wiring GL, the resistance of the semiconductor layer SEM of the thin film transistor is lowered. Thus, the voltage of the data wiring DL is transmitted to the source electrode SM formed with the low-resistant metal layer, and is transmitted to the transparent pixel electrode PIT connected through this and the pixel electrode contact hole CONT.

The common voltage that is another voltage applied to the liquid crystal layer is transmitted from the common drive electrode drive circuit 103 of FIG. 14 to the common electrode wiring MSL, and is further applied to the transparent common electrode CT through a common electrode contact hole CCONT formed at an insulating film. The transparent pixel electrode PIT includes an electrode portion having a predetermined width and a slit (aperture portion) within a planar region. In the slit, the electric field of the transparent pixel electrode PIT is applied from the upper surface for the liquid crystal driving to the liquid crystal layer, and this electric field reaches the transparent common electrode CT through the liquid crystal and the insulting film to produce a display.

As in the first embodiment, two contact holes are provided within the organic film contact hole OCONT. However, the second embodiment differs from the first embodiment in that one of these contact holes is the pixel electrode contact hole CONT connecting the source electrode SM and the transparent pixel electrode PIT and the other is the common electrode contact hole CCONT connecting the common electrode wiring MSL and the transparent common electrode CT.

The pixel electrode contact hole CONT and the common electrode contact hole CCONT that are these two contact holes are provided within the one organic film contact hole OCONT, and thus even when the organic film contact hole OCONT is used in which it is impossible to perform minute dimension processing and hence the aperture portion is increased in size, it is possible to enhance the aperture ratio.

The transparent common electrode CT is formed in the pixel region DIA over a plurality of pixels. The organic film contact hole OCONT described above is shared, and thus it is possible to enhance the aperture ratio and to supply a display device LCD that is bright and has low power consumption.

FIG. 16 is a diagram showing an example of a cross-sectional view taken along line XVI-XVI of FIG. 15. The cross-sectional view corresponds to the adjacent two pixel regions. Specifically, the structure of a route is shown in which, in one of the pixel regions, when a data potential is supplied from the data wiring DL and an on-voltage is applied to the gate wiring GL, the resistance of the semiconductor layers SEM is lowered, and this is transmitted from the source electrode SM to the transparent pixel electrode PIT and is accumulated in the retention capacity STG and the capacity of the liquid crystal layer LC. In the other pixel region, the structure of a route is shown in which the common electrode wiring MSL and the transparent common electrode CT are connected.

The pixel electrode contact hole CONT connecting the source electrode SM and the transparent pixel electrode PIT and the common electrode contact hole CCONT connecting the common electrode wiring MSL and the transparent common electrode CT in the adjacent pixel are formed within the organic film contact hole OCONT formed at the outside thereof. The pixel electrode contact hole CONT and the common electrode contact hole CCONT are formed in, for example, the stacked film of the protective film PAS formed with a thin silicon nitride and the upper insulting film UINS or the stacked layer of the protective film PAS and the gate insulting film GSN. As described above, the pixel electrode contact hole CONT can be processed to be narrow and have small dimensions.

On the other hand, as described above, the organic film contact hole OCONT is formed at the organic protective film OPAS of the thick photosensitive resist. As described above, since the organic film contact hole OCONT cannot be processed so as to have small dimensions, the organic film contact hole OCONT is formed into one so as to surround the two small pixel electrode contact holes CONT. Thus, it is possible to perform the arrangement without loss of the aperture ratio.

A method of manufacturing the display device according to the present embodiment will now be described. FIGS. 17 to 24 are diagrams for illustrating the method of manufacturing the display device according to the present embodiment. FIGS. 17A to 24A correspond to the steps of the plan view of FIG. 15, and FIGS. 17B to 24B show the corresponding cross-sectional views of FIGS. 17A to 24A. Specifically, FIGS. 17B to 24B show the steps of manufacturing the thin film transistor TFT formed on the first substrate SUB1, the wiring region and the aperture portion. The individual figures are basically shown per photo (exposure)-processing step in the TFT step described above. However, since the fourth photo-step is complicated, it is divided into two and is shown in FIGS. 20 and 21.

FIG. 17A shows a plan view of the pixel shown in FIG. 15 after the completion of the first photo-step of the thin film transistor TFT, and FIG. 17B shows a cross-sectional view taken along line VII-VII of FIG. 17A. As shown in FIGS. 17A and 17B, the gate wiring GL is formed into a film by sputtering on the first substrate, and is patterned in the first photo-step. The gate wiring GL is a stacked film in which, for example, molybdenum Mo is formed into a film on the upper surface of the copper of a thickness of 100 nm to 300 nm. As the wiring material, for example, not only copper Cu but also a stacked film of molybdenum Mo and aluminum Al, a stacked film of titanium Ti and aluminum Al, an alloy MoW of molybdenum Mo and tungsten or the like can be used. On the other hand, the common electrode wiring MSL is processed in the same step with the same metallic material as the gate wiring GL.

FIGS. 18A and 18B show a plan view and a cross-sectional view when the second photo-step is completed. As shown in FIGS. 18A and 18B, for example, on the gate wiring GL, the gate insulating film GSN of silicon nitride and the semiconductor layer SEM of amorphous silicon are stacked in layers by CVD. Here, the thickness of the gate insulating film GSN and the semiconductor layer SEM are, for example, about 400 nm and 200 nm, respectively. Then, a photoresist is formed from the upper portion of the CVD film described above, exposure is performed with a photo mask and thus the region of the semiconductor layer SEM is formed.

Figure 19A:
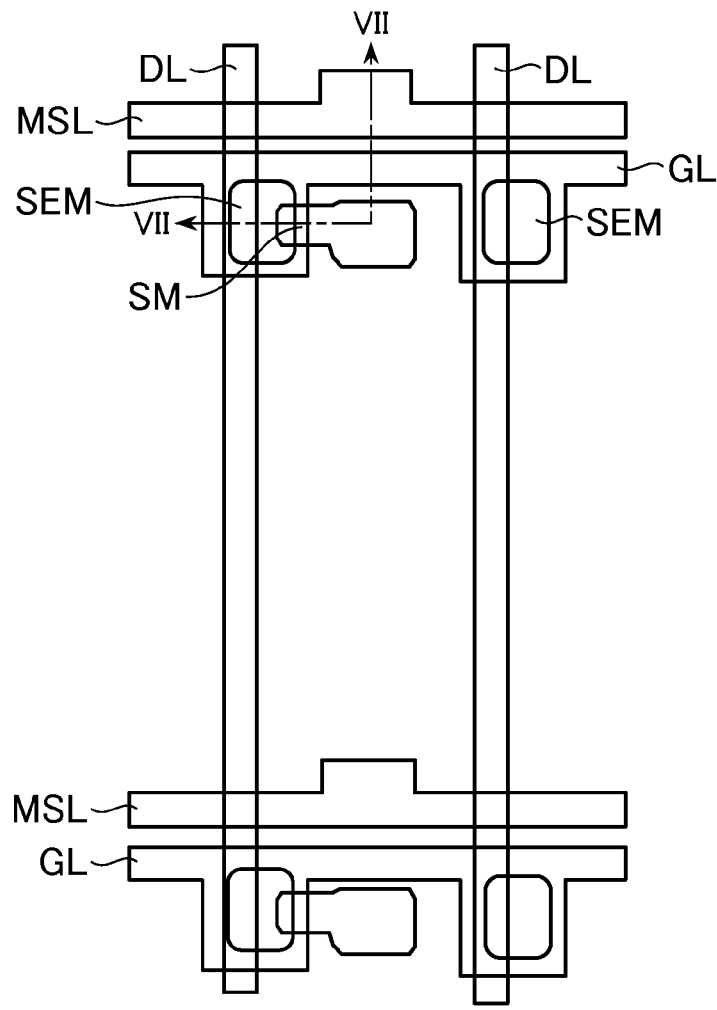
FIG. 19A is a diagram for illustrating a method of manufacturing a display device according to a second embodiment of the present application.
Figure 19B:
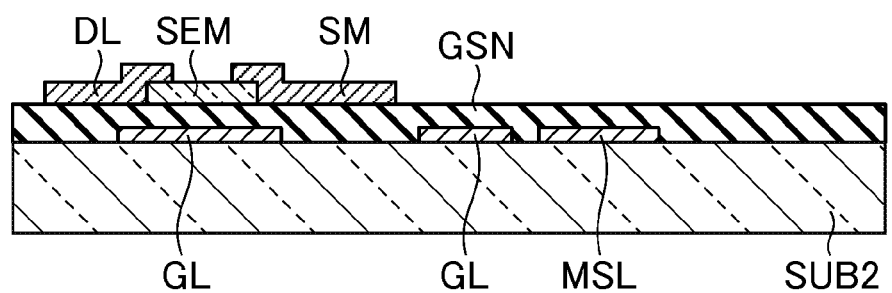
FIG. 19B is a diagram for illustrating a method of manufacturing a display device according to a second embodiment of the present application.

FIGS. 19A and 19B show a plan view and a cross-sectional view when the third photo-step is completed. As shown in FIGS. 19A and 19B, for example, on the upper portion of the semiconductor layer SEM, a stacked film of molybdenum Mo and copper Cu is formed by sputtering into a film. Here, as the material of the stacked film, for example, similar to the material of the gate wiring GL, a three-layer film of molybdenum Mo, aluminum Al and molybdenum Mo, a stacked film of titanium Ti and aluminum Al, an MoW alloy or the like can be used. Then, this is processed by the photo-step, and thus the regions of the data wiring DL and the source electrode SM are formed.

FIGS. 20A and 20B and 21A and 21B show plan views and cross-sectional views when the fourth photo-step is completed. Since this step is complicated, the plan view and the cross-sectional view in the middle of the step are shown in FIG. 20, and the plan view and the cross-sectional view after the completion of the step are shown in FIG. 21.

Figure 20A:
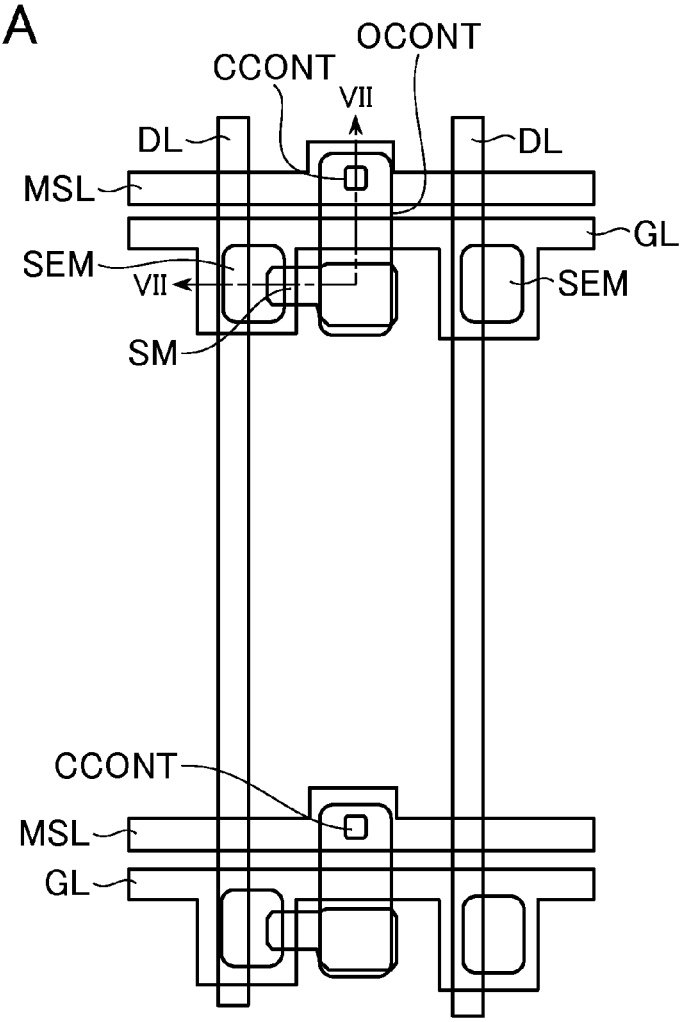
FIG. 20A is a diagram for illustrating a method of manufacturing a display device according to a second embodiment of the present application.
Figure 20B:
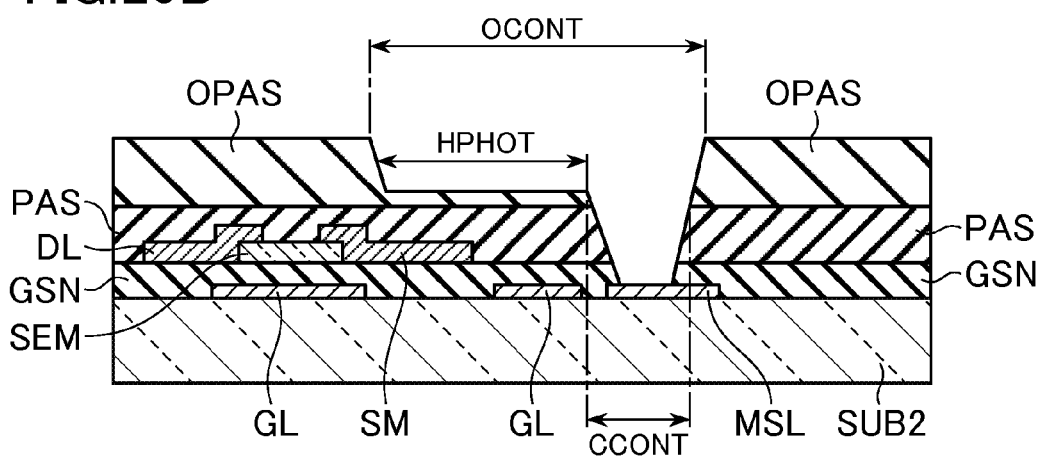
FIG. 20B is a diagram for illustrating a method of manufacturing a display device according to a second embodiment of the present application.

As shown in FIGS. 20A and 20B, on the data wiring DL and the source electrode SM, the protective film PAS is formed by CVD, and then the organic protective film OPAS of photosensitive acrylic is coated. Here, the protective film PAS is formed of, for example, silicon nitride, and its thickness is, for example, 200 to 400 nm. Since the material of the photosensitive acrylic itself can be used as the photoresist in the photo-step.

Here, as the photo mask, a photo mask using a halftone is used. In other words, since in the portion of the common electrode contact hole CCONT, there is no light shielding film in the photo mask, it is possible to remove the organic protective film OPAS of the photosensitive acrylic material with development processing. On the other hand, as compared with the organic protective film OPAS of the portion of CCONT, the organic protective film OPAS of a portion HPHOT where a light shielding film exists as the photo mask has a thicker film even after the development processing.

Within the aperture region of the organic protective film OPAS, a region to be exposed using a metallic film obtained by reducing the light shielding effect of the photo mask is formed. Hence, in this region width HPHOT, the photosensitive acrylic is slightly exposed, and the organic protective film OPAS is developed from the upper portion and remains as the thin organic protective film OPAS.

The development processing of the halftone exposure as described above is performed, and dry etching is further performed using this organic protective film OPAS as the resist. In this way, the protective film PAS and the gate insulating film GSN are processed and removed, and thus the common electrode contact hole CCONT is formed.

Figure 21A:
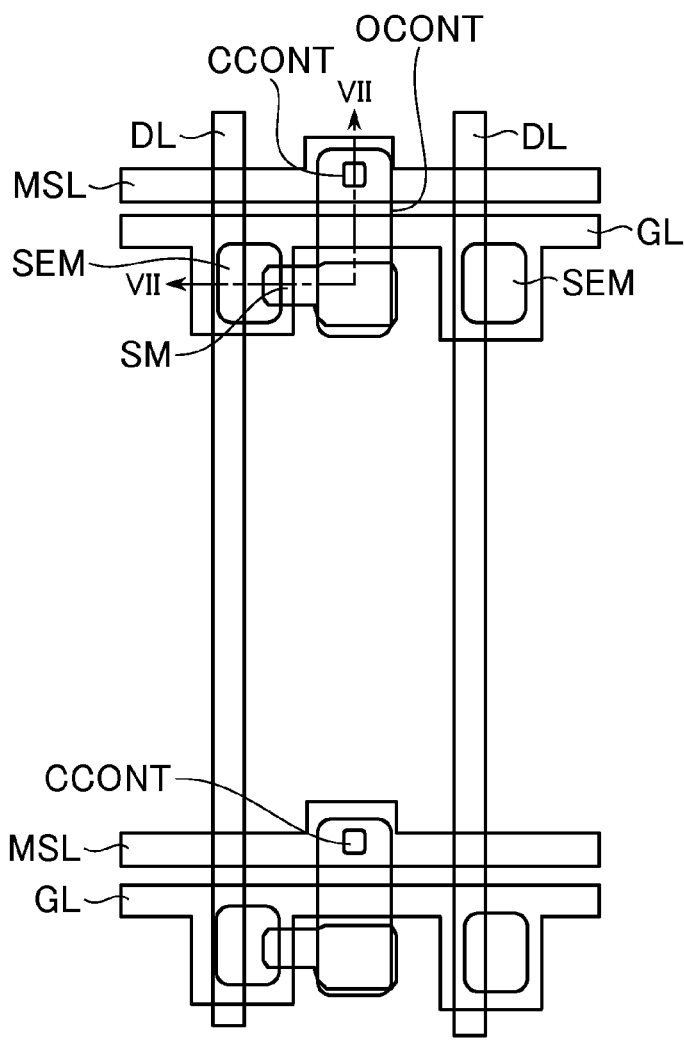
FIG. 21A is a diagram for illustrating a method of manufacturing a display device according to a second embodiment of the present application.
Figure 21B:
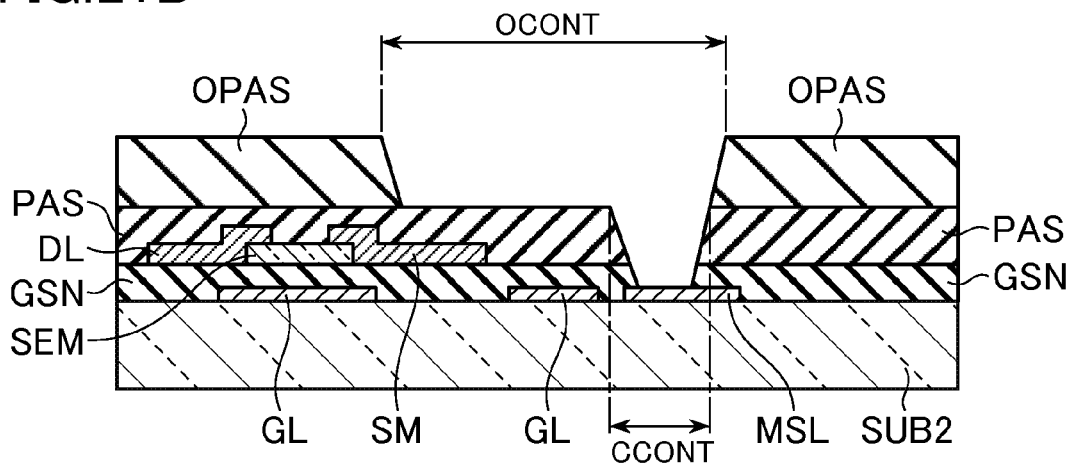
FIG. 21B is a diagram for illustrating a method of manufacturing a display device according to a second embodiment of the present application.

Then, as shown in FIGS. 21A and 21B, asking processing is performed to cut the organic protective film OPAS so as to be thin. With this processing, the organic protective film OPAS of the region HPHOT that is formed to be thin by the half exposure is removed. As found from FIGS. 21A and 21B, within the organic film contact hole OCONT, the region where the thin organic protective film OPAS is left is removed.

Figure 22A:
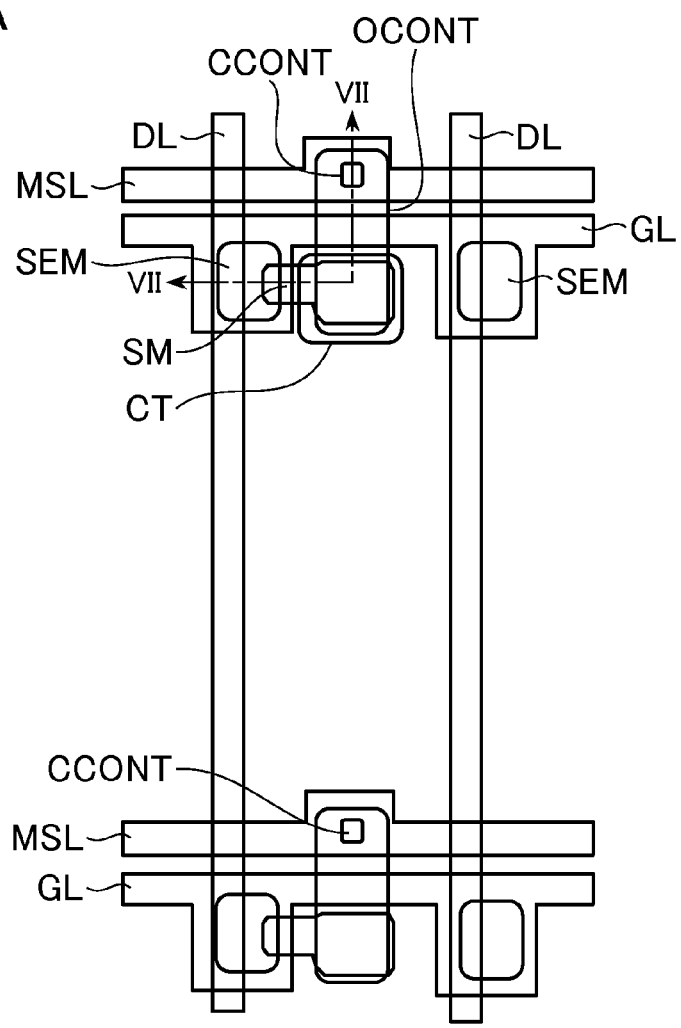
FIG. 22A is a diagram for illustrating a method of manufacturing a display device according to a second embodiment of the present application.
Figure 22B:
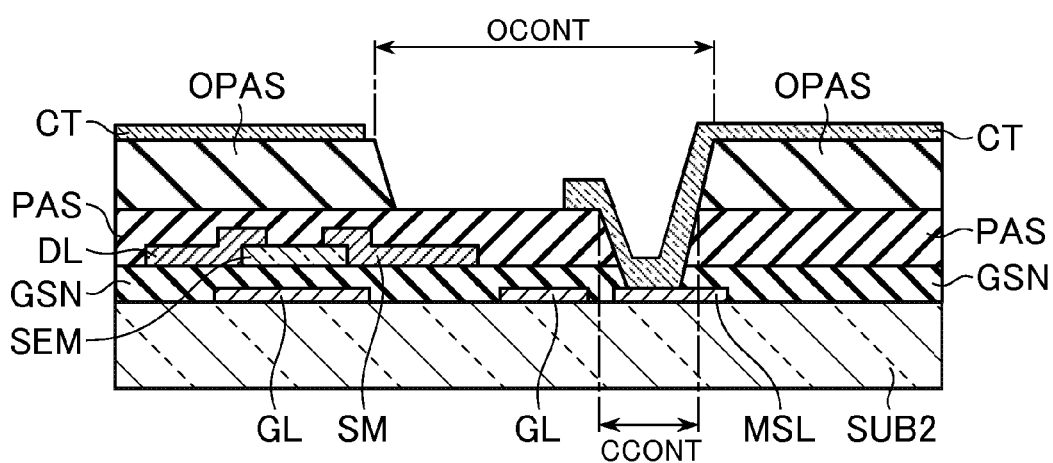
FIG. 22B is a diagram for illustrating a method of manufacturing a display device according to a second embodiment of the present application.

FIGS. 22A and 22B show a plan view and a cross-sectional view when the fifth photo-step is completed. As shown in FIGS. 22A and 22B, in order to form the transparent common electrode CT, the third transparent electrode material of indium-tin-oxide that is a transparent electrode material is formed into a film. Through the photo-etching step, the transparent common electrode CT is formed on the common electrode contact hole CCONT formed on the organic protective film OPAS and the common electrode wiring MSL. In this way, the transparent common electrode CT and the common electrode wiring MSL are connected, the resistance of the transparent common electrode CT is reduced and thus it is possible to realize satisfactory image quality without any wiring delay even in a large screen.

Figure 23A:
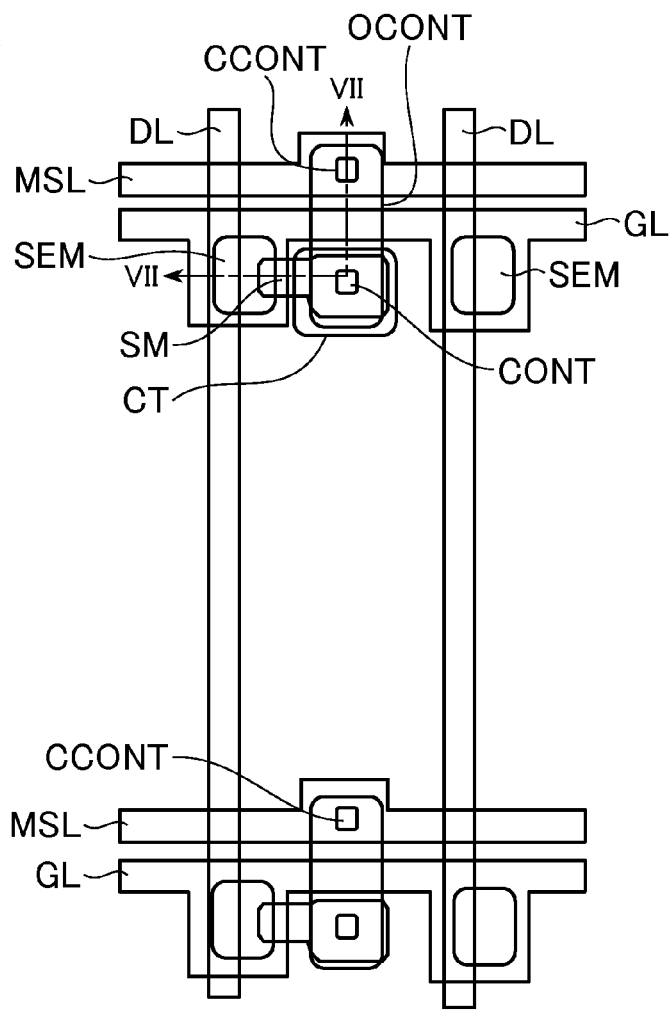
FIG. 23A is a diagram for illustrating a method of manufacturing a display device according to a second embodiment of the present application.
Figure 23B:
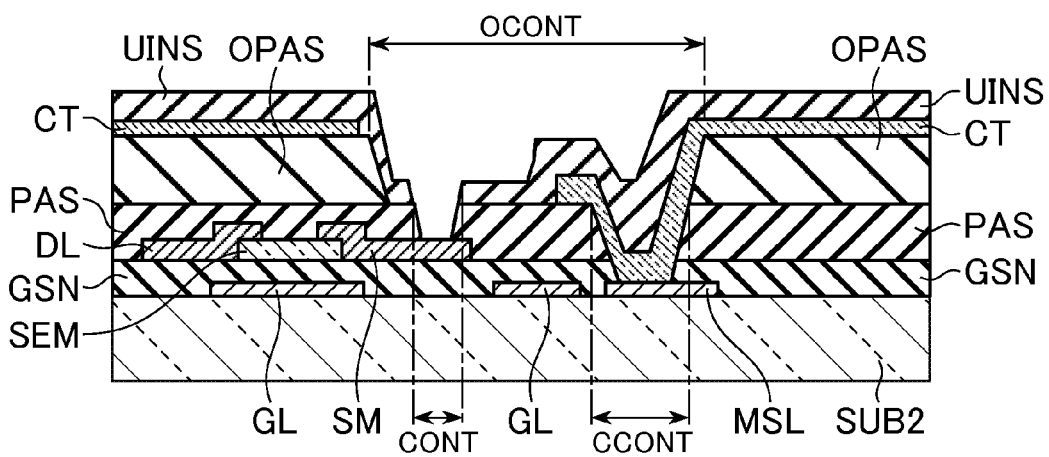
FIG. 23B is a diagram for illustrating a method of manufacturing a display device according to a second embodiment of the present application.

FIGS. 23A and 23B show a plan view and a cross-sectional view when the sixth photo-step is completed. As shown in FIGS. 23A and 23B, the upper insulating film UINS is formed on the transparent common electrode CT by CVD. Then, the pixel electrode contact hole CONT is formed on the protective film PAS and the upper insulating film UINS. Specifically, the pixel electrode contact hole CONT is formed by subjecting the insulating film where the protective film PAS on the source electrode SM and the upper insulating film UINS are stacked in layers to the photo-step and the dry etching step.

Figure 24A:
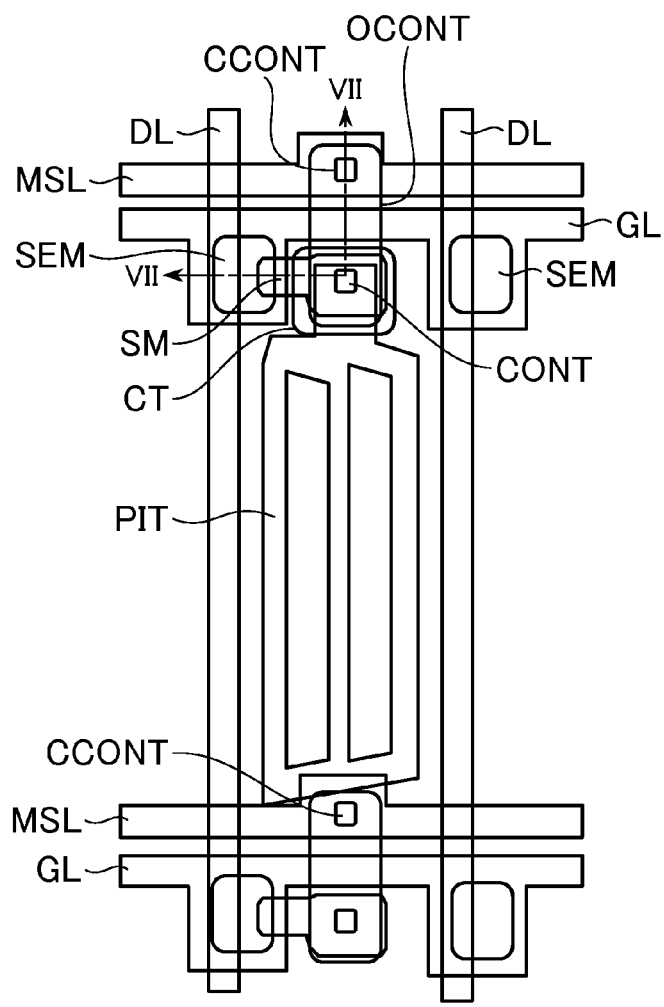
FIG. 24A is a diagram for illustrating a method of manufacturing a display device according to a second embodiment of the present application.
Figure 24B:
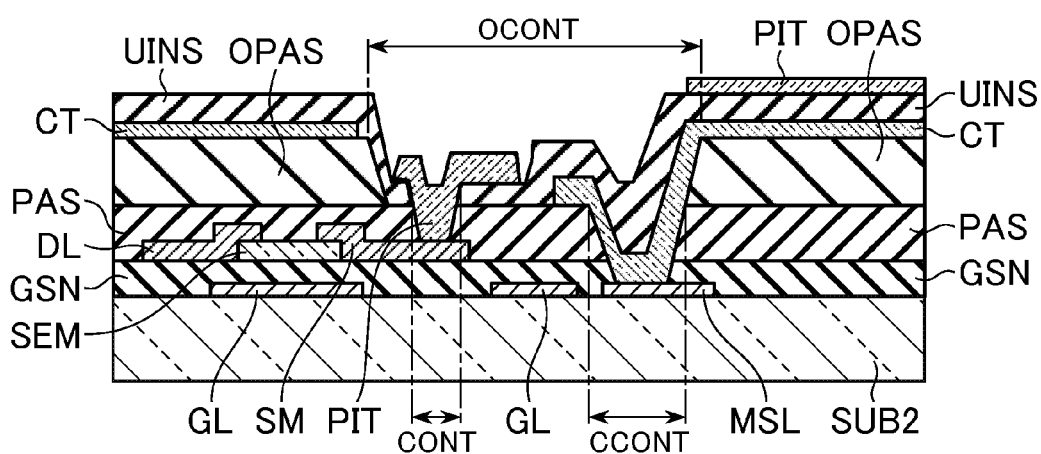
FIG. 24B is a diagram for illustrating a method of manufacturing a display device according to a second embodiment of the present application.

FIGS. 24A and 24B show a plan view and a cross-sectional view when the seventh photo-step is completed. As shown in FIGS. 24A and 24B, an indium-tin-oxide ITO1 that is the material of the transparent pixel electrode PIT is formed into a film, and then, the transparent pixel electrode PIT is formed by photo-etching. Here, the pixel electrode contact hole CONT that is the aperture portion connecting the transparent pixel electrode PIT and the source electrode SM is formed within the organic film contact hole OCONT of the organic protective film OPAS. As described above, the pixel electrode contact hole CONT and the common electrode contact hole CCONT are formed within the organic film contact hole OCONT, and thus the aperture ratio is enhanced.

As described above, it is possible to form the display device of the present embodiment. In the above description, only the steps of manufacturing the so-called TFT substrate (the second substrate SUB2) are discussed, and since the steps of manufacturing the color filter substrate (the first substrate SUB1) and the like are known, their description are omitted.

The present invention is not limited to the first and second embodiments described above, and may be replaced with the substantially same configuration as those described in the first and second embodiments, a configuration having the same effect of operation or a configuration that can achieve the same object. A first protective film and a second protective film as recited in the claims may correspond to, for example, the protective film PAS and the organic protective film OPAS, respectively. An insulting film as recited in claims may corresponds to, for example, the upper insulting film. UINS. Furthermore, a first contact hole as recited in the claims may corresponds to, for example, the organic film contact hole OCONT in the first and second embodiments, and second and third contact holes may correspond to, for example, the two pixel electrode contact holes CONT in the first embodiment or the pixel electrode contact hole CONT and the common electrode contact hole CCONT in the second embodiment.

What is claimed is:

1. A display device comprising a plurality of pixels arranged in a matrix, each of the plurality of pixels including:
   a transistor; and
   a pixel electrode arranged above the transistor through a first protective film and a second protective film,
   wherein among the plurality of pixels, the pixel electrodes of two pixels adjacent in a column direction are connected to corresponding source electrodes of the two pixels through second and third contact holes respectively, and
   wherein the second and third contact holes are formed in the first protective film within a first contact hole that is formed in the second protective film.

2. The display device of claim 1, wherein the first protective film is an inorganic insulating film, and the second protective film is an organic insulating film.

3. The display device of claim 1, further comprising:
   a plurality of gate wirings arranged in a row direction of the plurality of pixels; and
   a plurality of data wirings arranged in the column direction of the plurality of pixels,
   wherein the plurality of gate wirings are arranged in adjacent pairings in the column direction, with each set of adjacent pairings spaced further apart than a distance between the gate wirings of a given pairing.

4. The display device of claim 1, wherein among the plurality of pixels, the transistors adjacent in the column direction are staggered in the row direction.

5. A display device comprising:
   a transistor;
   a common electrode arranged above the transistor through a first protective film and a second protective film;
   a pixel electrode stacked on the common electrode through an insulting film and being opposite to the common electrode; and
   a common electrode wiring connected to the common electrode through the first protective film and the second protective film,
   wherein the pixel electrode and the common electrode are connected to a source electrode of the transistor and the common electrode wiring through second and third contact holes respectively, and
   wherein the second and third contact holes are formed in the first protective film and are positioned within a first contact hole that is formed in the second protective film.

6. The display device of claim 5, wherein the first protective film is an inorganic insulating film, and the second protective film is an organic insulating film.

7. The display device of claim 5, wherein the common electrode wiring is formed in the same layer as a gate electrode of the transistor.

8. The display device of claim 5, further comprising:
   a gate insulating film formed on the gate electrode and the common electrode,
   wherein the second contact hole is formed in the first protective film and the gate insulating film, and
   wherein the common electrode is connected to the common electrode wiring through the second contact hole.

9. The display device of claim 5, wherein the third contact hole is formed in the first protective film and the insulating film, and
   wherein the pixel electrode is connected to the source electrode of the transistor through the third contact hole.

10. A method of manufacturing a display device, comprising:
    forming a gate wiring on a substrate;
    forming a gate insulating film on the substrate on which the gate wiring is formed;
    forming at least two adjacent transistors on the gate insulting film;
    forming a protective film and an organic protective film in this order on the gate insulating film on which the two transistors are formed;
    forming a first contact hole in the organic protective film;
    forming a common electrode on the organic protective film;
    forming an upper insulating film on a region in which the first contact hole is formed and the common electrode;
    forming second and third contact holes in the protective film and the upper insulating film within the first contact hole, which are positioned above source electrodes of the two transistors; and
    forming a pixel electrode on the upper insulating film configured to cover the second and third contact holes and to be opposed to the common electrode.

11. A method of manufacturing a display device, comprising:
    forming a gate wiring and a common electrode wiring on a substrate;
    forming a gate insulating film on the substrate on which the gate wiring is formed;
    forming a transistor on the gate insulating film;
    forming a protective film and an organic protective film in this order on the gate insulating film on which the transistor is formed;
    forming a first contact hole by removing an upper portion of the organic protective film;
    forming a second contact hole in the protective film and the gate insulating film, which is positioned above the common electrode wiring within a region in which the first contact hole is formed;

forming a common electrode on the second contact hole and the organic protective film;

forming an upper insulting film at the region in which the first contact hole is formed and above the common electrode;

forming a third contact hole in the upper insulting film and the protective film, which is formed above a source electrode of the transistor positioned within the region in which the first contact hole is formed; and forming a pixel electrode on the upper insulting film configured to cover the third contact hole and to be directed to the common electrode.

12. The method of manufacturing a display device of claim 11, wherein the first contact hole and the second contact hole are formed by a halftone exposure in the same step.

13. The display device of claim 3, wherein the two pixels adjacent in the column direction are formed between two sets of the gate wirings of the given pairing.

14. The display device of claim 3, wherein the second and third contact holes are formed between the gate wirings of the given pairing.

* * * * *